United States Patent
Song et al.

(10) Patent No.: US 11,943,523 B2
(45) Date of Patent: Mar. 26, 2024

(54) IMAGE SENSOR DEVICES

(71) Applicant: Samsung Electronics Co., Ltd., Suwon-si (KR)

(72) Inventors: Insang Song, Hwaseong-si (KR); Hyunjin Kang, Seoul (KR); Seunghak Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 357 days.

(21) Appl. No.: 17/388,594

(22) Filed: Jul. 29, 2021

(65) Prior Publication Data

US 2022/0094825 A1 Mar. 24, 2022

(30) Foreign Application Priority Data

Sep. 23, 2020 (KR) .................. 10-2020-0122862

(51) Int. Cl.
*H04N 23/55* (2023.01)
*H01L 27/146* (2006.01)
*H04N 23/54* (2023.01)

(52) U.S. Cl.
CPC ....... *H04N 23/55* (2023.01); *H01L 27/14618* (2013.01); *H01L 27/14625* (2013.01); *H01L 27/14636* (2013.01); *H04N 23/54* (2023.01)

(58) Field of Classification Search
CPC ........ H04N 23/55; H04N 23/54; H04N 25/70; H01L 27/14618; H01L 27/14625; H01L 27/14636; H01L 27/14601; H05K 1/181; H05K 1/111
See application file for complete search history.

(56) References Cited

U.S. PATENT DOCUMENTS

| | | |
|---|---|---|
| 10,194,066 B2 | 1/2019 | Jung et al. |
| 10,270,946 B2 | 4/2019 | Dobashi |
| 10,341,542 B2 | 7/2019 | Dobashi |
| 2007/0200053 A1 | 8/2007 | Nomura et al. |
| 2009/0128681 A1* | 5/2009 | Kim .............. H04N 23/57 348/335 |
| 2011/0285890 A1* | 11/2011 | Choi .............. H04N 23/57 348/308 |
| 2014/0211054 A1* | 7/2014 | Kim .............. H04N 23/55 348/302 |
| 2019/0082084 A1 | 3/2019 | Lee |
| 2019/0174087 A1 | 6/2019 | Kim et al. |
| 2020/0028996 A1* | 1/2020 | Feng .............. G02B 7/08 |
| 2020/0192064 A1 | 6/2020 | Li et al. |
| 2022/0165641 A1* | 5/2022 | Nakayama ...... H01L 27/14618 |

FOREIGN PATENT DOCUMENTS

KR 10-2008-0051445 A 6/2008
KR 10-2019-0029171 A 3/2019

* cited by examiner

*Primary Examiner* — Jonathan Han
(74) *Attorney, Agent, or Firm* — Harness, Dickey & Pierce, P.L.C.

(57) ABSTRACT

An image sensor device includes an image sensor, a substrate including first and second pads spaced apart from each other, a first support member on which an optical filter is mounted, a second support member further adjacent to an outer edge of the substrate than the first support member, and an optical device on the optical filter and the image sensor, wherein the image sensor is electrically connected to the first pad, and wherein at least one of the first or second support members is electrically connected to the second pad.

20 Claims, 20 Drawing Sheets

XII-XII'

IMAGE SENSOR DEVICES

CROSS-REFERENCE TO RELATED APPLICATION

This application claims benefit of priority to Korean Patent Application No. 10-2020-0122862 filed on Sep. 23, 2020 in the Korean Intellectual Property Office, the disclosure of which is incorporated herein by reference in its entirety.

BACKGROUND

Example embodiments of the present inventive concepts relate to image sensor modules, also referred to herein interchangeably as image sensor devices.

To implement a high-resolution image, an image sensor module including a large area image sensor may be mounted in an electronic device such as a digital camera or a camera phone. To maintain sensitivity of a large-region image sensor, development of an image sensor module which may reduce stress acting on an image sensor has been necessary

SUMMARY

Some example embodiments of the present inventive concepts provide an image sensor module, also referred to herein interchangeably as an image sensor device, configured to reduce stress (e.g., a magnitude of stress) acting on an image sensor included in the image sensor module, where the image sensor may be a large-region image sensor. Such an image sensor module may enable sensitivity of a large-region image sensor to be maintained, thereby improving operational performance of the image sensor and thus of the image sensor module.

According to some example embodiments of the present inventive concepts, an image sensor device may include an image sensor; a substrate including an upper surface and a lower surface opposite to each other, one or more inner surfaces at least partially defining a cavity extending through the substrate in a vertical direction that extends perpendicular to the upper surface, wherein the image sensor is at least partially within the cavity, and first and second pads isolated from direct contact with each other in a horizontal direction extending parallel to the upper surface, the first and second pads being on the upper surface. The image sensor device may include an optical filter on both the substrate and the image sensor, a first support member between the substrate and the optical filter, the optical filter being in direct contact with the first support member, a second support member adjacent to the first support member on the substrate and closer to an outer edge of the substrate than the first support member in the horizontal direction, and an optical device overlapping the optical filter and the image sensor in the vertical direction. The image sensor may be electrically connected to the first pad. At least one of the first or second support members may be electrically connected to the second pad.

According to some example embodiments of the present inventive concepts, an image sensor device may include a substrate having an upper surface on which a first pad and a second pad are located while being spaced apart from each other in a horizontal direction extending parallel to the upper surface, a lower surface opposite to the upper surface, and one or more inner surfaces at least partially defining a cavity extending from the upper surface to the lower surface in a vertical direction extending perpendicular to the upper surface. The image sensor device may include an upper stiffener on the upper surface of the substrate, the upper stiffener having one or more inner surfaces at least partially defining an opening at least partially overlapping with the cavity in the vertical direction, a lower stiffener on the lower surface of the substrate, an image sensor in the cavity and on the lower stiffener, an optical filter on the upper stiffener and covering the cavity and the opening, and an optical device on the image sensor and the optical filter. The image sensor may be electrically connected to the first pad. The upper stiffener may be electrically connected to the second pad.

According to some example embodiments of the present inventive concepts, an image sensor device may include a substrate having an upper surface on which first and second pads are located, the substrate further having a lower surface that is opposite to the upper surface. The image sensor device may include an image sensor on or in the substrate and electrically connected to the first pad, an upper stiffener on the upper surface of the substrate and electrically connected to the second pad, and an optical filter on the image sensor and the upper stiffener.

BRIEF DESCRIPTION OF THE DRAWINGS

The above and other aspects, features, and advantages of the present inventive concepts will be more clearly understood from the following detailed description, taken in conjunction with the accompanying drawings, in which.

DETAILED DESCRIPTION

Figure 1:
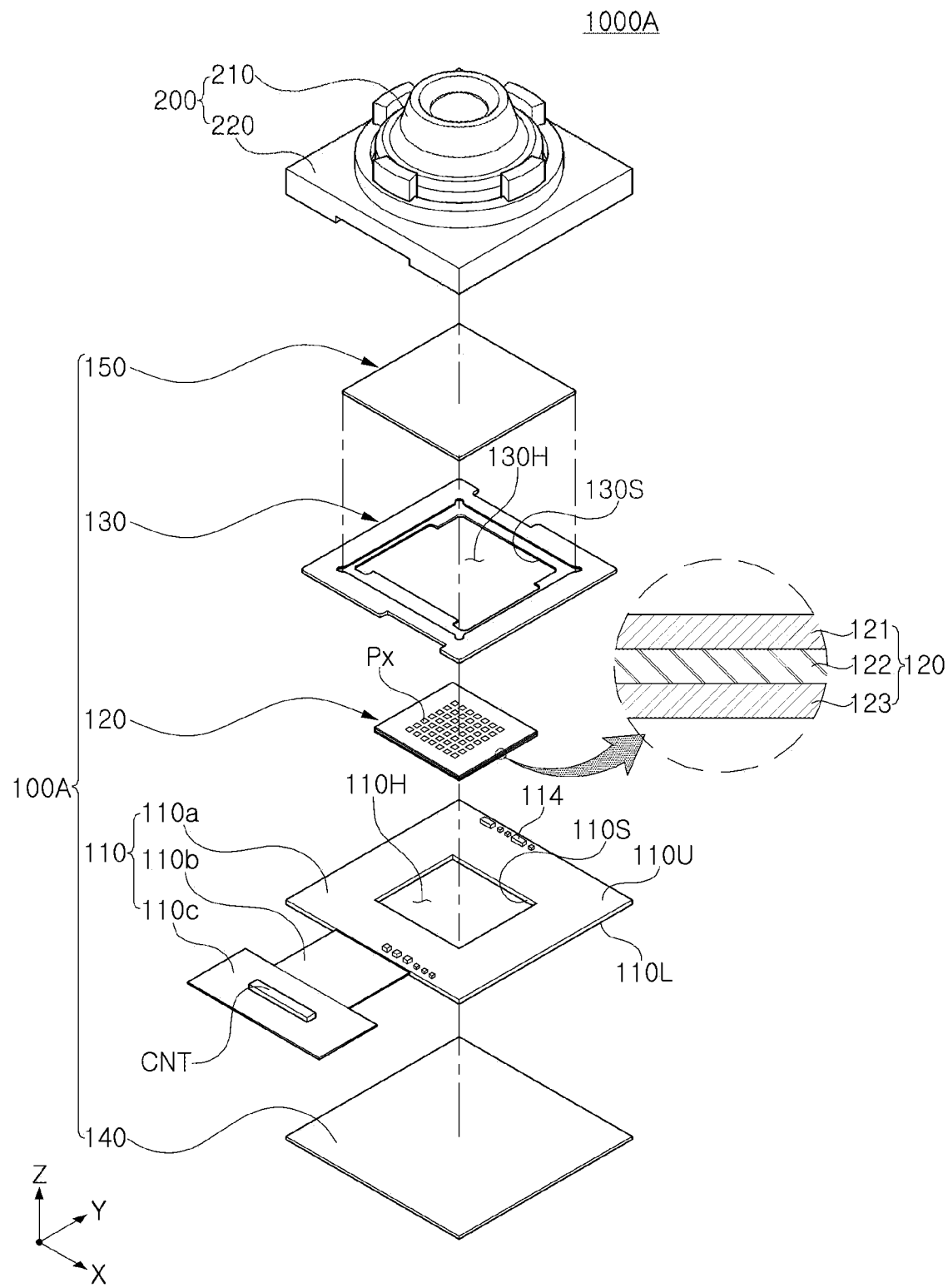
FIG. 1 is an exploded perspective diagram illustrating an image sensor module according to some example embodiments of the present inventive concepts.

Hereinafter, example embodiments of the present inventive concepts will be described as follows with reference to the accompanying drawings. It will be understood that the same reference numerals are assigned to the same or similar constituent elements throughout the specification.

In some example embodiments, when a certain part with a layer, film, region, plate, etc. is said to be "on" another part, the part may be "above" or "below" the other part. In some example embodiments, when a certain part with a layer, film, region, plate, etc. is said to be "on" another part, the part may be "indirectly on" or "directly on" the other part. When a certain part is said to be "indirectly on" another part, an interposing structure and/or space may be present between the certain part and the other part such that the certain part and the other part are isolated from direct contact with each other. Conversely, when a certain part is said to be "directly on" another part, it means that there is no other part between the certain part and the other part such that the certain part is in direct contact with the other part.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is an exploded perspective diagram illustrating an image sensor module 1000A according to some example embodiments. It will be understood that "module" and "device" may be used interchangeably herein, and therefore an image sensor module according to any of the example embodiments may be interchangeably referred to as an image sensor device.

Referring to FIG. 1, the image sensor module 1000A may include a first module 100A (e.g., first device) and a second module 200 (e.g., second device, or "optical module," also referred to herein interchangeably as an "optical device") mounted on an upper portion of the first module 100A. The first module 100A may include a substrate 110, an image sensor 120, first and second stiffeners 130 and 140, and an optical filter 150.

The substrate 110 may include a flexible substrate, a rigid substrate, and/or a flexible-rigid substrate. For example, the substrate 110 may be configured as a flexible-rigid substrate including a first rigid substrate 110a, a second rigid substrate 110c, and a first flexible substrate 110b connecting the first rigid substrate 110a to the second rigid substrate 110c. The image sensor 120 and a plurality of passive devices 114 may be mounted on or in the first rigid substrate 110a. The plurality of passive devices 114 may include passive devices such as, for example, resistors, capacitors, diodes, transistors, relays, and electrically erasable programmable read only memories (EEPROM). A connector CNT connected to another electronic device may be disposed on the second rigid substrate 110c. The first flexible substrate 110b may electrically connect the first and second rigid substrates 110a and 110c to each other. The image sensor 120 may be electrically connected to another electronic device through the connector CNT.

The image sensor 120 may be mounted on (e.g., directly or indirectly on) an upper surface 110U of the substrate 110 or on an upper surface of the second stiffener 140. For example, as illustrated in FIG. 1, the substrate 110 may have a cavity 110H (e.g., the substrate 110 may include one or more inner surfaces 110S at least partially defining a cavity 110H extending at least partially through the substrate 110 in the Z-axis direction) in which the image sensor 120 is at least partially accommodated (e.g., located), and the image sensor 120 disposed (e.g., located) in the cavity 110H may be mounted on an upper surface 140U of the second stiffener 140. In some example embodiments, the image sensor 120 may be mounted on the upper surface of the substrate 110 (see FIG. 10). The image sensor 120 may include a sensor region 121 having a pixel array Px and a logic region 122 disposed on a lower surface of the sensor region 121. For example, the image sensor 120 may include a complementary metal oxide semiconductor (CMOS). The image sensor 120 may further include a storage region 123 disposed on a lower surface of the logic region 122. The storage region 123 may store image data obtained by the sensor region 121 and processed by the logic region 122. For example, the storage region 123 may include a volatile memory device such as a dynamic RAM (DRAM) or a static RAM (SRAM), or a nonvolatile memory device such as a phase change RAM (PRAM), a magnetic RAM (MRAM), a resistive RAM (RRAM), a flash memory, and the like.

The first and second stiffeners 130 and 140 may include a ceramic material or a metal material which may control warpage of the substrate 110 and may withstand an external impact. For example, the first and second stiffeners 130 and 140 may include iron (Fe) or a metal alloy (e.g., stainless steel) including iron (Fe). The first stiffener 130 may be mounted on the upper surface of the substrate 110 and may occupy 40% or more of a plane area (e.g., cross-sectional area and/or surface area in a plane extending in the X-axis direction and the Y-axis direction) of the substrate 110, 50% to 80% of the plane area, for example. In the case of the large-area image sensor 120, a lens and a substrate 110 having an area corresponding thereto may be required. The first stiffener 130 may be mounted on a spare area of the substrate 110 other than a mounting area of the passive device 114 and the optical filter 150. The first stiffener 130 may relieve stress acting on the image sensor 120 along with the second stiffener 140 disposed on (e.g., below) the lower surface 110L of the substrate 110 (e.g., attached to the lower surface 110L of the substrate 110). The image sensor 120 requiring a large-area substrate 110 on which the first stiffener 130 may be mounted may have an optical format of 1/1.33 inch or more. For example, the image sensor 120 may have an optical format ranging from 1/1.33 inch to ¼ inch. The optical format may be defined as a value obtained by dividing a diagonal length (in mm) of the sensor image region by 16. For example, the optical format of the image sensor 120 having a pixel size of 0.8 μm and a number of pixels of 108 MP may be calculated as 1/1.33 inch. For example, the optical format of the image sensor 120 having a pixel size of 1.2 μm and a number of pixels of 50 MP may be calculated as 1/1.31 inch.

The optical filter 150 may be disposed in an upper portion of the image sensor 120 and may be supported by the first stiffener 130 (or a "first support member" 131 described later). The optical filter 150 may be fixed to the first stiffener 130 (or a "first support member" 131 described later) by an adhesive. The optical filter 150 may filter infrared or near-infrared rays and may thus improve image quality of the image sensor 120. For example, the optical filter 150 may include an IR filter.

The second module 200 (or "optical module") may be disposed in a path of light incident to the optical filter 150 and the image sensor 120 such that light incident in one direction (e.g., in the Z-axis direction) may be incident to the image sensor 120. Restated, and as shown in at least FIG. 1, the second module 200 may overlap the image sensor 120 and the optical filter 150 in the vertical direction that extends perpendicular to the upper surface 110U of the substrate 110 (e.g., Z-axis direction), such that the second module 200 is configured to direct incident light through the second module 200 and further to the image sensor 120 through the optical filter 150. The second module 200 may include a lens assembly 210 and a lens housing 220. The lens assembly 210 may be on (e.g., directly or indirectly on, vertically overlapping, etc.) the optical filter 150 and may include at least one or more lenses. For example, the lens assembly 210 may include a plurality of lenses arranged in a vertical direction (Z-axis direction). The lens housing 220 may be on (e.g., directly or indirectly on, vertically overlapping, etc.) the substrate 110 and/or the second support member 132 and may be configured to accommodate and support (e.g., structurally support the structural load, or weight, of) the lens assembly 210. The lens housing 220 may include a holder unit supporting the lens assembly 210 and a driving unit driving the lens assembly 210 in an optical axis direction (e.g., the Z axis direction).

Figure 2:
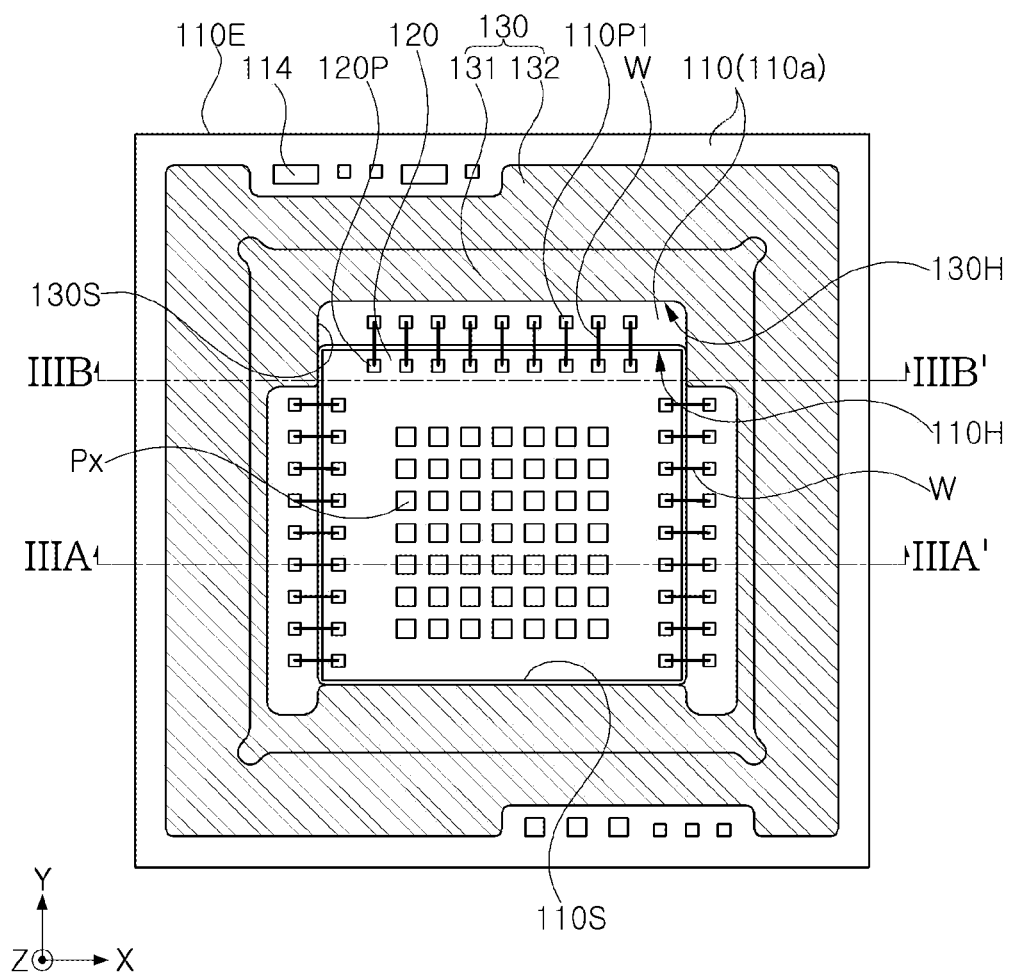
FIG. 2 is a plan diagram illustrating a portion of elements of a first module in the image sensor module illustrated in FIG. 1 according to some example embodiments of the present inventive concepts.
Figure 3A:
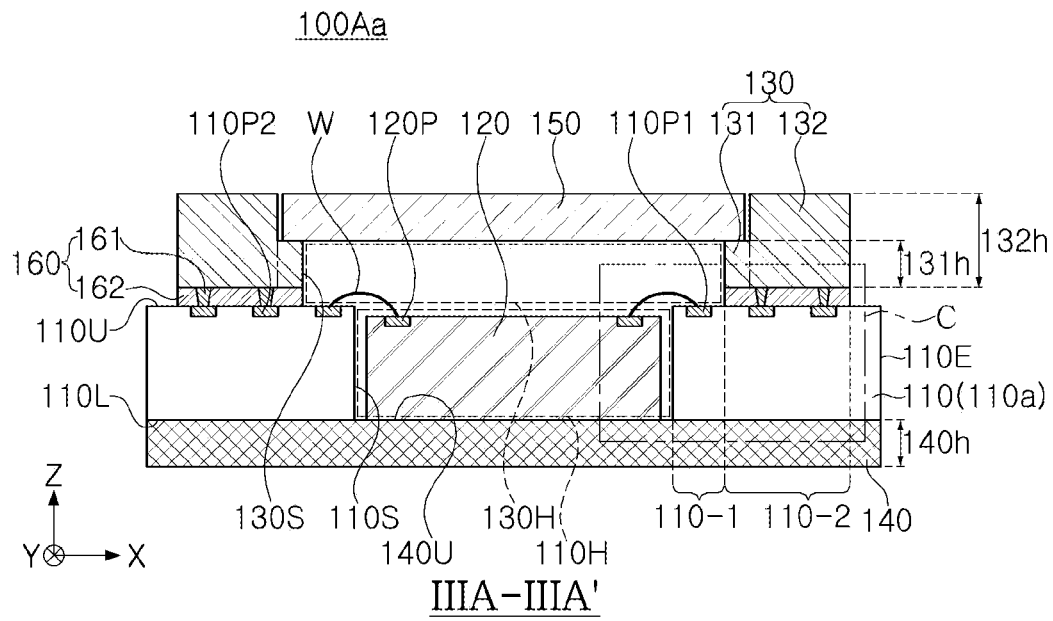
FIGS. 3A and 3B are cross-sectional diagrams along lines IIIA-IIIA' and IIIB-IIIB' in FIG. 2, respectively, according to some example embodiments of the present inventive concepts.
Figure 3B:
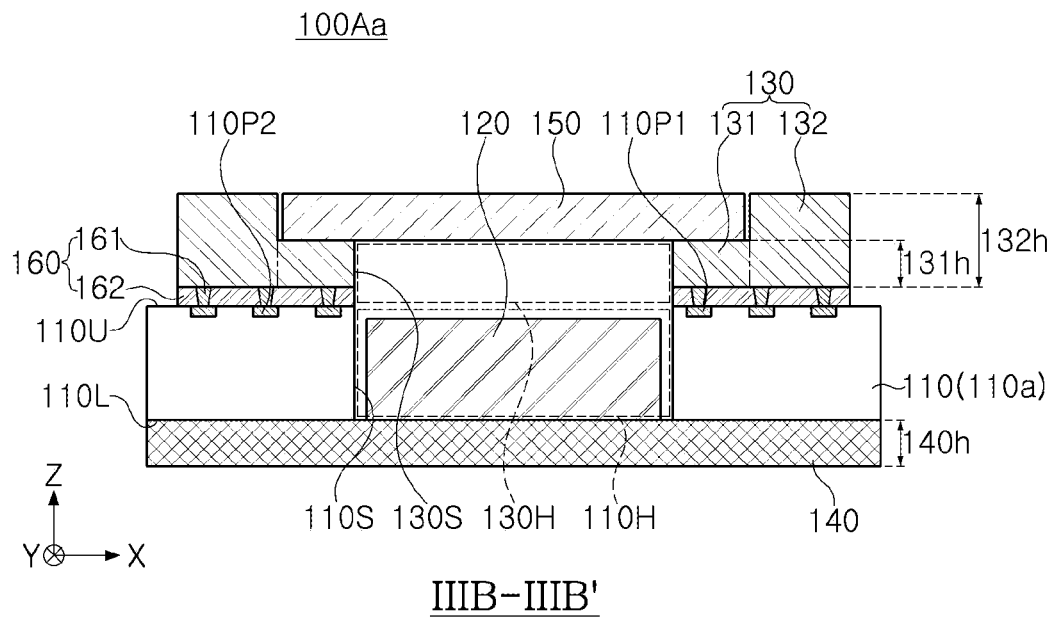
Figure 3C:
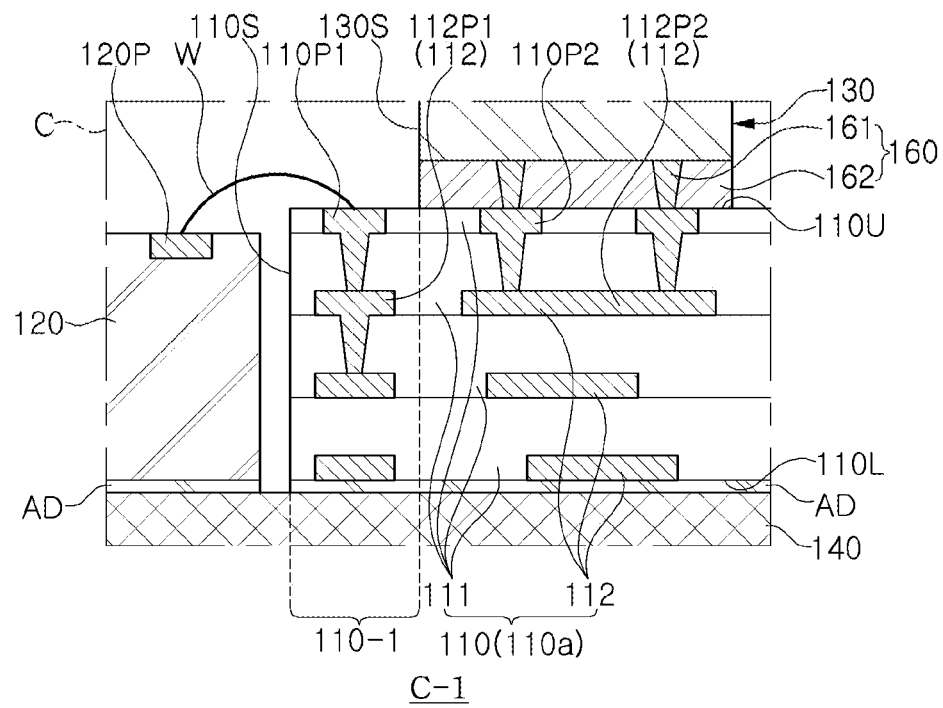
FIGS. 3C and 3D are enlarged diagrams illustrating region "C" illustrated in FIG. 3A, according to some example embodiments of the present inventive concepts.
Figure 3D:
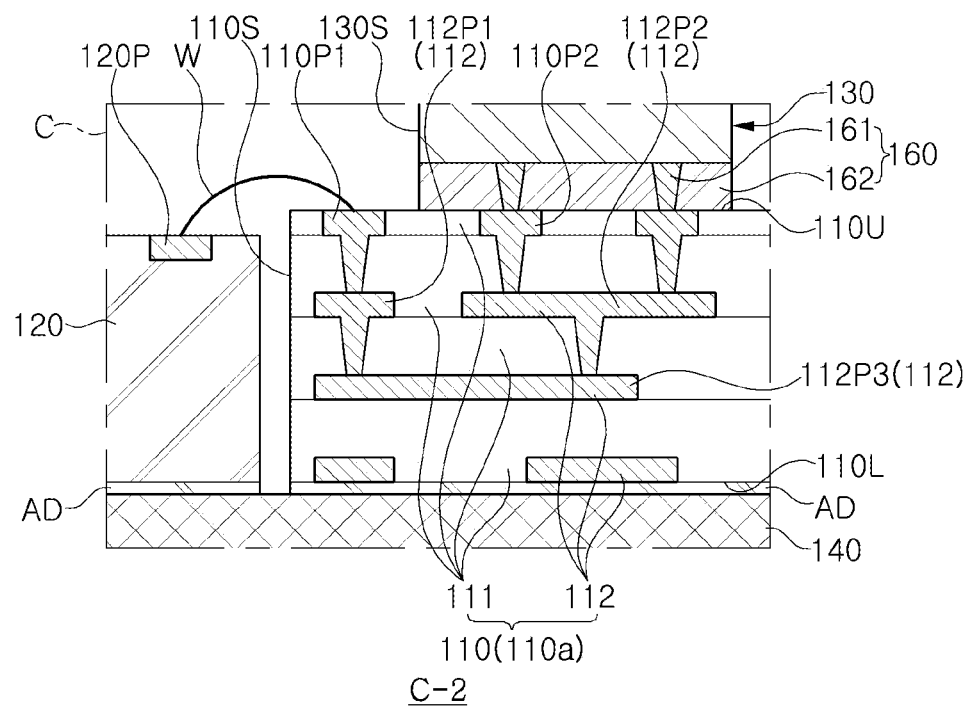

FIG. 2 is a plan diagram illustrating a portion of elements of a first module in the image sensor module 1000A illustrated in FIG. 1. FIGS. 3A and 3B are cross-sectional diagrams along lines IIIA-IIIA' and IIIB-IIIB' in FIG. 2, respectively. FIGS. 3C and 3D are enlarged diagrams illustrating region "C" illustrated in FIG. 3A. FIG. 2 does not illustrate the first flexible substrate 110b, the second rigid substrate 110c, and the optical filter 150 illustrated in FIG. 1, and illustrates a bonding relationship among the substrate 110, the image sensor 120, and the first stiffener 130 on a plane.

Referring to FIGS. 2, 3A and 3B, a first module 100Aa in an example may include a substrate 110, an image sensor 120, a first stiffener 130 (or "upper stiffener"), a second stiffener 140 (or "lower stiffener"), and an optical filter 150.

As shown in at least FIG. 1, substrate 110 may include an upper surface 110U on which first and second pads 110P1 and 110P2 spaced apart from each other (e.g., isolated from direct contact with each other) are disposed (e.g., the first and second pads 110P1 and 110P2 may be directly or indirectly on the upper surface 110U), a lower surface 110L opposite to the upper surface, and a cavity 110H accommodating the image sensor 120. Restated, the substrate 110 may include, in addition to the upper surface 110U and the lower surface 110L opposite to each other, one or more inner surfaces 110S that at least partially define a cavity 110H extending through the substrate 110 in a vertical direction extending perpendicular to the upper surface 110U (e.g., the Z-axis direction). In an example, the cavity 110H may extend from the upper surface 110U to the lower surface 110L of the substrate 110 and may penetrate (e.g., extend through an entire thickness in the vertical direction Z of) the substrate 110. One or more passive devices 114 may be disposed between the first stiffener 130 and an outer edge of the substrate 110 and may be on (e.g., directly or indirectly on) the upper surface of the substrate 110. As illustrated in FIG. 2, the passive device 114 may be disposed between the first stiffener 130 or the second support member 132 and the edge of the substrate 110 on a plane. As shown, the first and second pads 110P1 and 110P2 may be isolated from direct contact with each other in a horizontal direction extending parallel to the upper surface 110U of the substrate 110 (e.g., the X-axis direction and/or the Y-axis direction).

Referring to FIGS. 3C and 3D, the substrate 110 may have a multilayer structure including a plurality of insulating layers 111 and one or a plurality of wiring layers 112 (e.g., at least one wiring layer). The plurality of insulating layers 111 may include a thermosetting resin such as an epoxy resin, a thermoplastic resin such as a polyimide resin, a resin in which an inorganic filler and/or a glass fiber (or a glass cloth or a glass fabric) is impregnated in the thermosetting resin or the thermoplastic resin, such as prepreg, Ajinomoto build-up film (ABF), FR-4, bismaleimide triazine (BT), or the like. The one or plurality of wiring layers 112 (e.g., the at least one wiring layer) may include a signal pattern, a power pattern, and a ground pattern. As shown in FIGS. 3C-3D, the first pad 110P1 of the substrate 110 may be electrically connected to at least one of a signal pattern, a power pattern, or a ground pattern of the one or plurality of wiring layers 112 (e.g., the ground pattern in the uppermost wiring layer 112 in FIG. 3C), and the second pad 110P2 may be electrically connected to the ground pattern (e.g., the uppermost wiring layer 112 shown in FIG. 3C). The one or plurality of wiring layers 112 and the first and second pads 110P1 and 110P2 may include a metal material such as copper (Cu), aluminum (Al), silver (Ag), tin (Sn), gold (Au), nickel (Ni), lead (Pb), titanium (Ti), or alloys thereof. The one or plurality of wiring layers 112 and the first and second pads 110P1 and 110P2 disposed on different levels may be electrically connected to each other through a conductor via penetrating the insulating layer 111. As described herein, a "level" of an element may refer to a vertical distance of the element from the upper surface 110U of the substrate 110 in the vertical direction (e.g., the Z-axis direction).

The first pad 110P1 and the second pad 110P2 may be insulated from each other or may be electrically connected to each other through the wiring layer 112 of the substrate 110. For example, as illustrated in FIG. 3C, when the first pad 110P1 is connected to the first wiring layer 112P1 including a signal pattern, a power pattern, or a ground pattern, and the second pad 110P2 is connected to the second wiring layer 112P2 including a ground pattern, the first pad 110P1 and the second pad 110P2 may be insulated from each other. For example, as illustrated in FIG. 3D, when the first pad 110P1 and the second pad 110P2 are connected to the third wiring layer 112P3 including the same ground pattern, the first pad 110P1 and the second pad 110P1 may be electrically connected to each other. The first pad 110P1 and the second pad 110P2 may be protected by a solder mask, and may have a solder mask defined (SMD) shape or a non-solder mask defined (NSMD) shape.

The image sensor 120 may be disposed on or in the substrate 110. The image sensor 120 may be understood to be on the substrate 110 when the image sensor 120 is on (e.g., directly on) a surface of the substrate 110, for example as shown in FIGS. 8, 12-13, and 14A-14B. The image sensor 120 may be understood to be in the substrate when the image sensor 120 is located at least partially between the upper and lower surfaces 110U and 110L of the substrate 110 in the vertical direction (e.g., Z-axis direction), for example as shown in FIGS. 3A-3D. For example, the image sensor 120 may be accommodated in the cavity 110H of the substrate 110 (e.g., located within the cavity 110H and between the upper and lower surfaces 110U and 110L in the vertical direction, or Z-axis direction) and may be mounted on (e.g., directly or indirectly on) the second stiffener 140 covering the lower surface 110L of the substrate 110 (e.g., the image sensor 120 may be directly on the upper surface 140U of the second stiffener 140). The image sensor 120 may include a connection pad 120P disposed on an upper surface, and the connection pad 120P may be electrically connected to the first pad 110P1 of the substrate 110. For example, the connection pad 120P may be electrically connected to the first pad 110P1 by a bonding wire W. Thus, it will be understood that the image sensor 120 may be electrically connected to the first pad 110P1 (e.g., via connection pad 120P and bonding wire W). In an example, the image sensor 120 may be a large-sized sensor having an optical format of 1/1.33 inch or more. For example, the image sensor 120 may have an optical format in a range of 1/1.33 inch to 1 inch.

The first stiffener 130 may be disposed on the upper surface of the substrate 110 and may have an opening 130H corresponding to (e.g., partially, entirely, and/or exactly overlapping in the vertical direction, or Z-axis direction) the cavity 110H. Restated, the first stiffener 130 may include one or more inner surfaces 130S that may at least partially define the opening 130H extending partially or completely through the first stiffener 130 (e.g., in the vertical direction Z). The first stiffener 130 may include a first support member 131 disposed adjacent to the cavity 110H and supporting the optical filter 150 and a second support member 132 surrounding an external side of the optical filter 150. The first support member 131 may be disposed between the substrate 110 and the optical filter 150 (e.g., in the Z-axis direction) and may support a lower portion of the optical filter 150. As shown, optical filter 150 may be mounted on (e.g., may be directly or indirectly on) the first support member 131, such that the first support member 131 is configured to support a structural load (e.g., weight) of the optical filter 150. As shown, the optical filter 150 may be understood to be "on" (e.g., indirectly on) both the substrate 110 and the image sensor 120, for example such that the optical filter 150 may at least partially overlap at least the image sensor 120 and/or the substrate 110 in the vertical direction (e.g., Z-axis direction). As shown, the optical filter 150 may be understood to be "on" (e.g., indirectly on) both the upper stiffener 130 and the image sensor 120, for example such that the optical filter 150 may at least partially overlap at least the image sensor 120 and/or the upper stiffener 130 in the vertical direction (e.g., Z-axis direction). For example, the optical filter 150 may completely overlap the image sensor 120 in the vertical direction and partially overlap the substrate 110 in the vertical direction. As shown, the optical filter 150 may cover (e.g., completely overlap in the vertical direction, or Z-axis direction) both the cavity 110H and the opening 130H. A thickness 131h of the first support member 131 between the substrate 110 and the optical filter 150 in the vertical direction (Z-axis direction) may determine a distance between the image sensor 120 and the optical filter 150, and thus, the thickness may be varied in some example embodiments. The thickness 131h of the first support member 131 between the substrate 110 and the optical filter 150 in the vertical direction (Z-axis direction) may be greater than a thickness of the image sensor 120 in the vertical direction. The second support member 132 may be adjacent to the first support member 131 on the substrate 110 and may be further adjacent to an edge of the substrate 110 than the first support member 131 (e.g., may be closer to an outer edge 110E of the substrate 110 than the first support member 131 in a horizontal direction extending parallel to the upper surface 110U, such as the X-axis direction and/or the Y-axis direction). The second support member 132 may surround an edge or a side surface of the optical filter 150. For example, the thickness 132h of the second support member 132 in the vertical direction (Z-axis direction) may be greater than the thickness 131h of the first support member 131 in the vertical direction (Z-axis direction), and the upper surface of the second support member 132 may be disposed on a level the same as or higher than a level of the upper surface of the optical filter 150.

In an example, the first and second support members 131 and 132 may be integrated with each other (e.g., may be separate portions of a single, continuous piece of material). The first support member 131 may extend in a direction (X-axis and Y-axis directions) horizontal to the upper surface of the substrate 110 and may have an opening 130H exposing the first region 110-1 of the upper surface of the substrate 110 and the image sensor 120. Restated, the first support member 131 may have one or more inner surfaces 130S that at least partially define the opening 130H which may expose the image sensor 120 and a first region of the upper surface 110U in the vertical direction (e.g., Z-axis direction). The first region 110-1 may be a region of the upper surface of the substrate 110 more adjacent to (e.g., closer to) the image sensor 120 than the second support member 132, the region which does not overlap the first and second support members 131 and 132 in the vertical direction (Z-axis direction). As shown in FIGS. 3A-3B, the second support member 132 may extend from one side of the first support member 131 in a direction (Z-axis direction) perpendicular to the upper surface of the substrate 110 (e.g., the vertical direction as described herein). In this case, for example as shown in FIG. 3A, the first pad 110P1 may be disposed on (e.g., directly on) the first region 110-1 of the upper surface of the substrate 110 exposed in the vertical direction (Z-axis direction) through the first support member 131 or the opening 130H of the first stiffener 130. The second pad 110P2 may be disposed on (e.g., directly on) the second region 110-2 of the upper surface of the substrate 110 which is not exposed in the vertical direction (Z-axis direction) through the first support member 131 or the opening 130H of the first stiffener 130. The first and second support members 131 and 132 may be attached to the second region 110-2, and the second region 110-2 may surround the first region 110-1 (e.g., in the X-axis direction and/or Y-axis direction) and may overlap the first and second support members 131 and 132 in the vertical direction (Z-axis direction). The first pad 110P1 does not overlap the first and second support members 131 and 132 or the first stiffener 130 in the vertical direction (Z-axis direction), and the second pad 110P2 may overlap the first and second support members 131 and 132 or the first stiffener 130 in the vertical direction (Z-axis direction). For example, referring to FIG. 2, a plane area of the opening 130H may be greater than a plane area of the cavity 110H in a direction (X-axis and Y-axis directions) horizontal to the upper surface of the substrate 110. Restated, the cross-sectional area of the opening 130H in a first plane extending in the X-axis direction and the Y-axis direction and thus extending parallel to the upper surface 110U of the substrate 110 may be greater than a cross-sectional area of the cavity 110H in a second plane that may be the same or different plane as the first plane and also extending parallel to the upper surface 110U of the substrate 110 in the X-axis direction and the Y-axis direction. The cavity 110H may be disposed in the plane area of the opening 130H (e.g., may overlap said plane area in the vertical direction), and the first pad 110P1 may be disposed adjacent to the cavity 110H in a direction (X-axis and Y-axis directions) horizontal to the upper surface of the substrate 110 (e.g., the horizontal direction) and may be exposed through the opening 130H in the direction (Z-axis direction) perpendicular to the upper surface of the substrate 110 (e.g., the vertical direction).

The first stiffener 130 may be electrically connected to the second pad 110P2 on the upper surface of the substrate 110 through an electrical connection structure 160. The electrical connection structure 160 may include a plurality of electrical connection members 161 electrically connecting the first stiffener 130 to the second pad 110P2, and an insulating member 162 surrounding the electrical connection member 161 between the first stiffener 130 and the substrate 110. For example, at least one of the first or second support members 131 or 132 may be electrically connected to the second pad 110P2. The electrical connection member 161 may be disposed between (e.g., directly between) at least one of the first or second support members 131 or 132 (e.g., at least one support member) and the substrate 110 and may directly contact the second pad 110P2, and the insulating member 162 may surround the electrical connection member 161 between the at least one of the first or second support members 131 or 132 (e.g., the at least one support member) and the substrate 110, thereby enabling the at least one support member of the first or second support members 131 or 132 to be electrically connected to the second pad 110P2. The electrical connection member 161 may include a metal material such as copper (Cu), aluminum (Al), silver (Ag), tin (Sn), gold (Au), nickel (Ni), lead (Pb), titanium (Ti), or alloys thereof. For example, the electrical connection member 161 may include tin (Sn) or a low melting point metal alloy including tin (Sn). The insulating member 162 may include an insulating material such as a non-conductive film. The at least one support member (e.g., the at least one of the first or second support members 131 or 132) electrically connected to the second pad 110P2 may include iron (Fe) or a first metal alloy that includes iron (Fe).

The second stiffener 140 may be attached to the lower surface of the substrate 110. As illustrated in FIGS. 3C and 3D, the image sensor 120 and the substrate 110 may be adhered to the upper surface of the second stiffener 140 by an adhesive member AD. The adhesive member AD may include, for example, an insulating adhesive including an epoxy resin. In an example, a thickness 140h of the second stiffener 140 in the vertical direction (Z-axis direction) may be substantially the same as, or smaller than, a thickness 131h of the first support member 131 between the optical filter 150 and the substrate 110 in the vertical direction (Z-axis direction).

The optical filter 150 may be mounted on the first stiffener 130. The optical filter 150 may be aligned with the image sensor 120 in the optical axis direction (e.g., Z axis direction), and may cover the cavity 110H of the substrate 110 and the opening 130H of the first stiffener 130. The optical filter 150 may be fixed to the first stiffener 130 by an adhesive including an epoxy resin, for example.

FIGS. 4A, 4B, 4C, and 4D are cross-sectional diagrams illustrating a process of manufacturing a first module 100Aa illustrated in FIG. 3A.

Figure 4A:
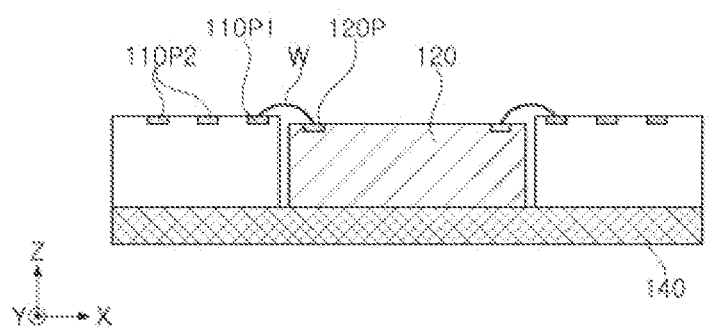
FIGS. 4A, 4B, 4C, and 4D are cross-sectional diagrams illustrating a process of manufacturing a first module illustrated in FIG. 3A, according to some example embodiments of the present inventive concepts.

Referring to FIG. 4A, the substrate 110 and the image sensor 120 may be attached to the second stiffener 140, and the image sensor 120 and the substrate may be electrically connected to each other. The second stiffener 140 may be configured as, for example, a metal plate including stainless steel. The substrate 110 and the image sensor 120 may be attached to the second stiffener 140 by an insulating adhesive such as a non-conductive film. The image sensor 120 may be connected to the substrate 110 by a wire-bonding process. The connection pad 120P of the image sensor 120 may be connected to the first pad 110P1 of the substrate 110. The substrate 110 may be configured as a substrate for a semiconductor package including a printed circuit board (PCB), a ceramic substrate, a glass substrate, and a tape wiring board. The substrate 110 may have a cavity 110H accommodating the image sensor 120. The cavity 110H may be formed by a laser drilling process or an etching process, for example.

Figure 4B:
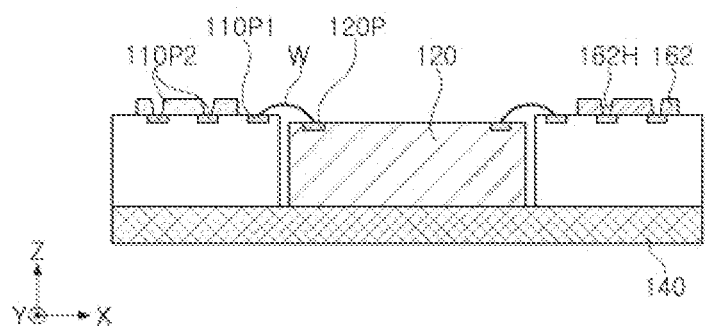

Referring to FIG. 4B, an insulating member 162 may be disposed on the upper surface of the substrate 110. The insulating member 162 may be disposed on the second pad 110P2 on the upper surface of the substrate 110. The insulating member 162 may be disposed to expose the first pad 110P1. The insulating member 162 may be attached to and cured on the substrate 110 through heat treatment. Thereafter, a through-hole 162H penetrating the insulating member 162 and exposing at least a portion of the second pad 110P2 may be formed. The through-hole 162H may be formed using a laser drill.

Figure 4C:
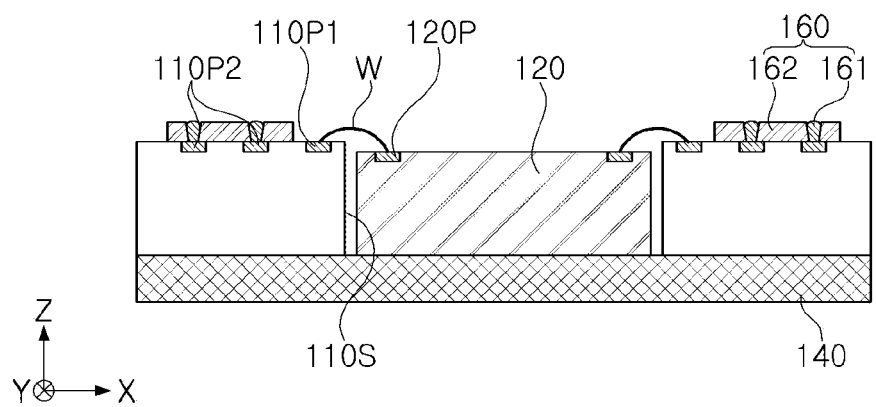

Referring to FIG. 4C, an electrical connection member 161 may be disposed in the through-hole 162H in FIG. 4B. The electrical connection member 161 may include, for example, solder. The electrical connection structure 160 formed on the substrate 110 may include an electrical connection member 161 on the second pad 110P2 and an insulating member 162 surrounding the electrical connection member 161. A portion of the electrical connection member 161 may be coupled to the electrical connection member 161 in the through-hole 162H while being attached to the lower surface of the first stiffener 130 attached later.

Figure 4D:
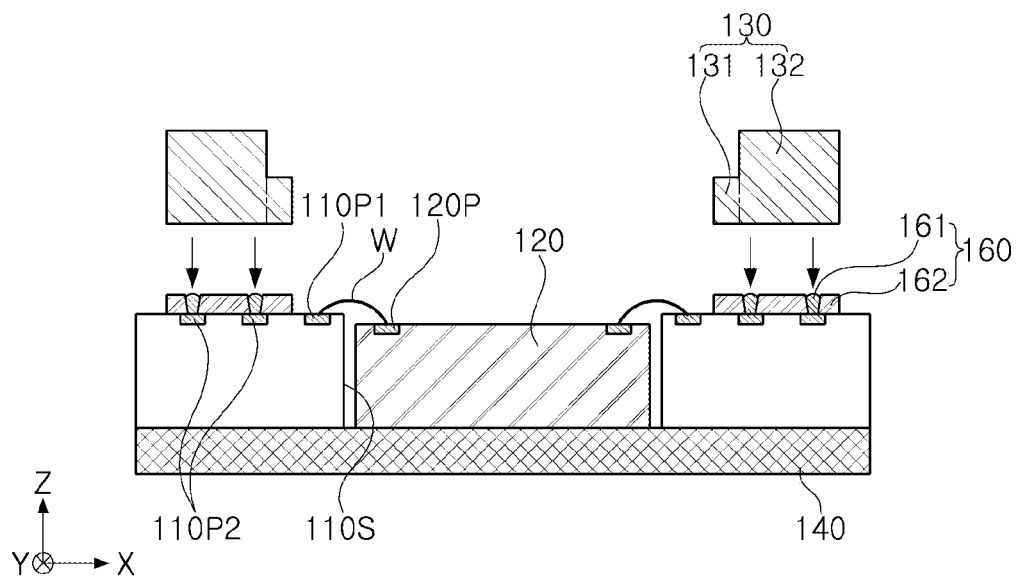

Referring to FIG. 4D, a first stiffener 130 may be disposed on the electrical connection structure 160. The first stiffener 130 may include, for example, stainless steel. The first stiffener 130 may be coupled to the electrical connection structure 160 by a reflow process. To relieve stress acting on the image sensor 120, the first stiffener 130 may have a plane area of a certain level or more (e.g., 40% or more of the plane area of the substrate) on the substrate 110. The insulating member 162 may be formed in a range corresponding to the plane area of the first stiffener 130.

Figure 5:
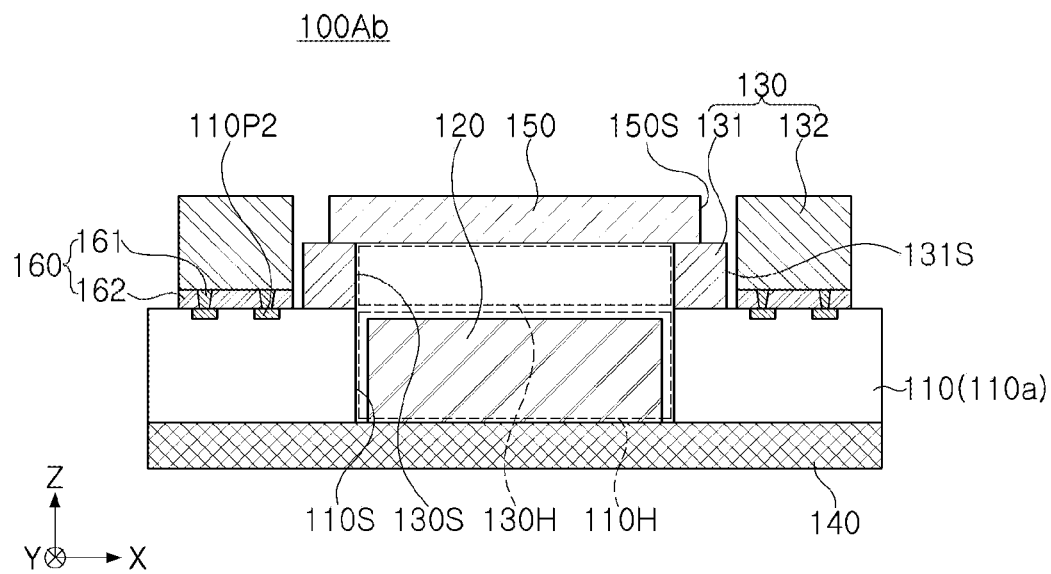
FIG. 5 is a cross-sectional diagram illustrating a modified example of a first module in an image sensor module according to some example embodiments of the present inventive concepts.

FIG. 5 is a cross-sectional diagram illustrating a modified example of a first module 100Ab in an image sensor module 1000A according to some example embodiments.

Referring to FIG. 5, in the modified example, a first stiffener 130 may include a first support member 131 and a second support member 132 separated from each other. For example, the first support member 131 and the second support member 132 may be separated from each other (e.g., isolated from direct contact with each other) in a horizontal direction that extends parallel to the upper surface 110U of the substrate 110 (e.g., X-axis direction and/or Y-axis direction), and the second support member 132 may extend in the horizontal direction (X-axis and Y-axis directions) to surround both an outer side surface 131S of the first support member 131 and an outer side surface 150S of the optical filter 150 in the horizontal direction (e.g., at least partially overlaps the outer side surface 131S of the first support member 131 and the outer side surface 150S of the optical filter 150 in the X-axis direction and/or the Y-axis direction). Differently from the second support member 132, the first support member 131 may include an insulating material. For example, the first support member 131 may include an insulating material such as an epoxy molding compound (EMC), and the second support member 132 may include a conductive material such as stainless steel. Alternatively, the first support member 131 may include a conductive material the same as or different from that of the second support member 132. The first support member 131 may not be electrically connected to the substrate 110, and the second support member 132 may be electrically connected to the substrate 110 and may be connected to a ground pattern.

Figure 6:
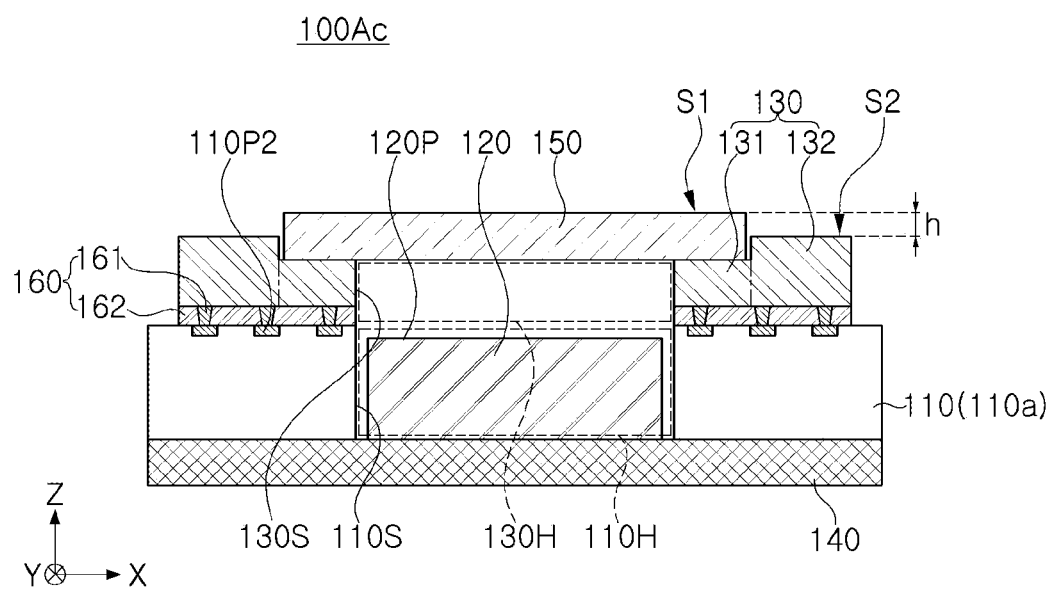
FIG. 6 is a cross-sectional diagram illustrating a modified example of a first module in an image sensor module according to some example embodiments of the present inventive concepts.

FIG. 6 is a cross-sectional diagram illustrating a modified example of a first module 100Ac in an image sensor module 1000A according to some example embodiments.

Referring to FIG. 6, in the modified example, an uppermost surface S2 of the first stiffener 130 may be disposed on a level lower than a level of an upper surface S1 of the optical filter 150. For example, the upper surface S2 of the second support member 132 may be disposed between the lower surface and the upper surface S1 of the optical filter 150. Since the upper surface S2 of the second support member 132 and the upper surface S1 of the optical filter 150 have a difference h therebetween, a process of attaching the optical filter 150 may be easily performed.

Figure 7A:
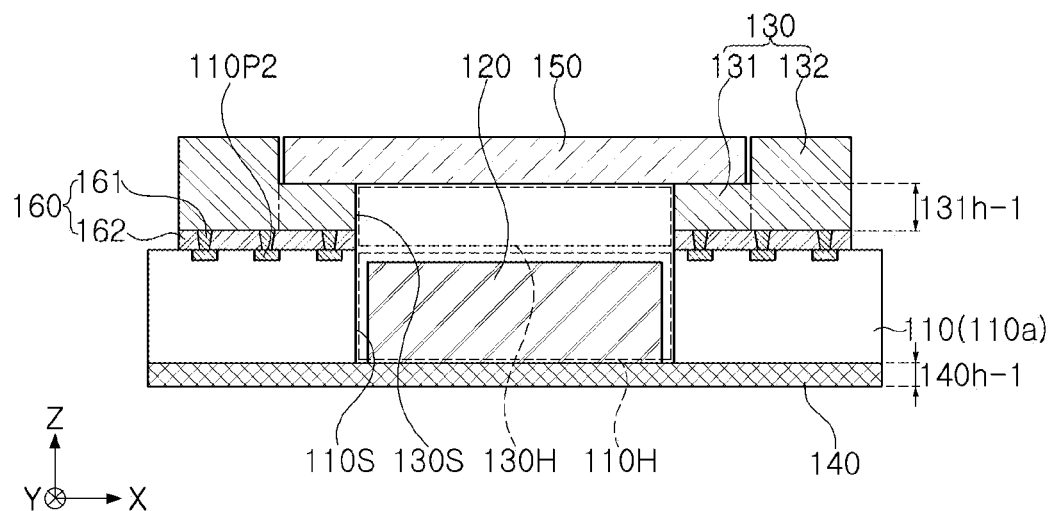
FIGS. 7A and 7B are cross-sectional diagrams illustrating a modified example of a first module in an image sensor module according to some example embodiments of the present inventive concepts.
Figure 7B:
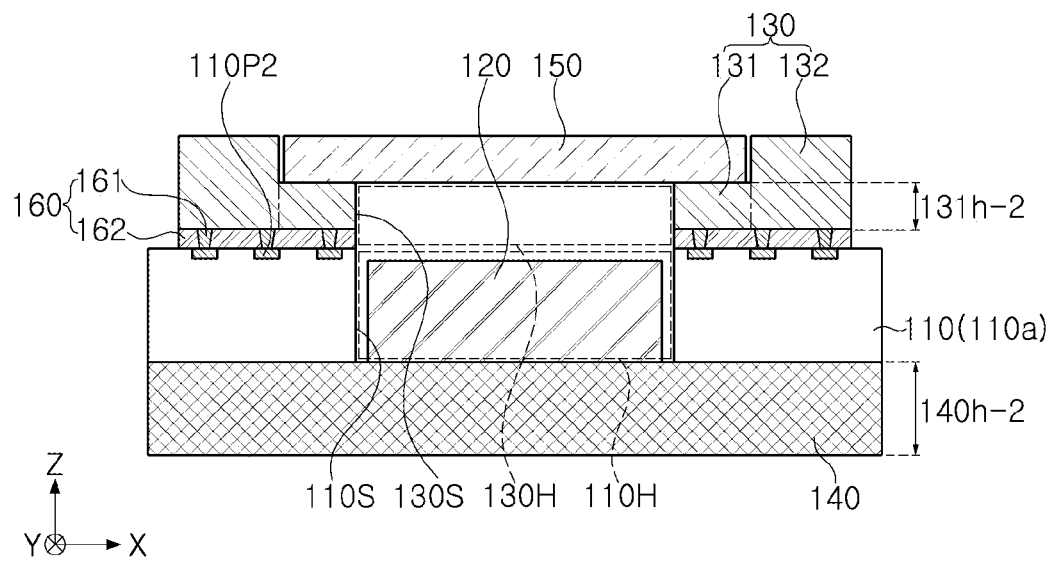

FIGS. 7A and 7B are cross-sectional diagrams illustrating a modified example of a first module 100Ad-1 or 100Ad-2 in an image sensor module 1000A according to some example embodiments.

Referring to FIGS. 7A and 7B, in the modified example, the first stiffener 130 and the second stiffener 140 may have different thicknesses. A thickness of the first stiffener 130 may be determined according to a distance between the image sensor 120 and the optical filter 150. The thickness of the first stiffener 130 may be defined as a thickness of the first support member 131 between the optical filter 150 and the substrate 110. When the thickness and a region of the first stiffener 130 are sufficiently secured, sizes of the first module and the image sensor module may be reduced by reducing the thickness of the second stiffener 140. For example, as illustrated in FIG. 7A, a thickness 140h-1 of the second stiffener 140 in the vertical direction (Z-axis direction) may be less than a thickness 131h-1 of the first support member 131, disposed between the optical filter 150 and the substrate 110, in the vertical direction (Z-axis direction). When the thickness of the first stiffener 130 is not sufficiently secured, by increasing the thickness of the second stiffener 140, stress acting on the substrate 110 and the image sensor 120 may be reduced. For example, as illustrated in FIG. 7B, a thickness 140h-2 of the second stiffener 140 in the vertical direction (Z-axis direction) may be greater than a thickness 131h-2 of the first support member 131 disposed between the optical filter 150 and the substrate 110 in the vertical direction (Z-axis direction).

Figure 8:
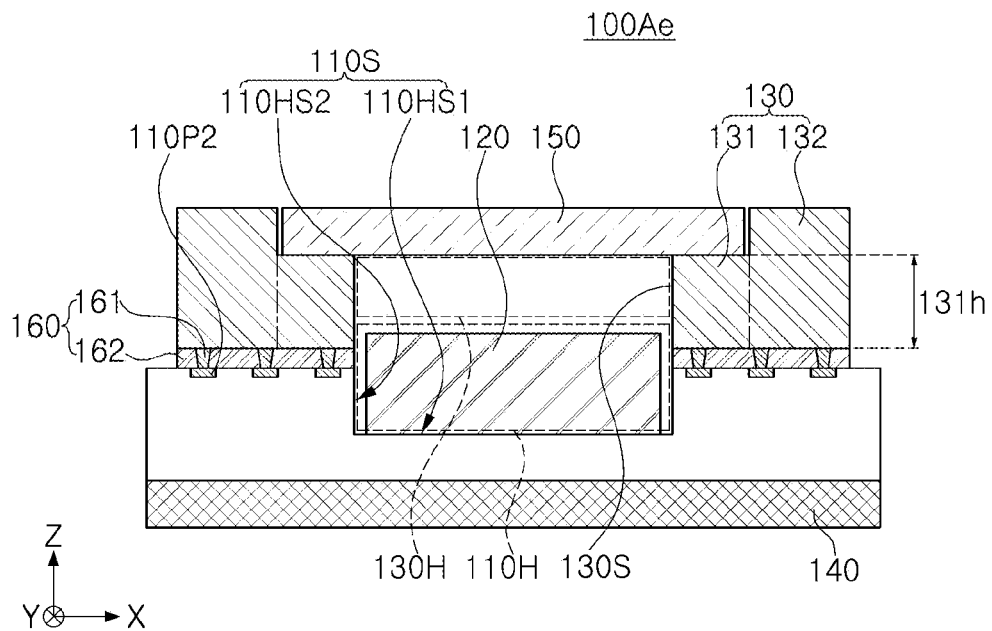
FIG. 8 is a cross-sectional diagram illustrating a modified example of a first module in an image sensor module according to some example embodiments of the present inventive concepts.

FIG. 8 is a cross-sectional diagram illustrating a modified example of a first module 100Ae in an image sensor module 1000A according to some example embodiments.

Referring to FIG. 8, in the modified example, the cavity 110H of the substrate 110 may have a recess structure concave from an upper surface to a lower surface of the substrate 110. For example, the cavity 110H may be formed by (e.g., at least partially defined by) an internal bottom surface 110HS1 of the substrate 110 disposed between the upper surface and the lower surface of the substrate 110 and an internal side surface 110HS2 of the substrate 110 connecting the upper surface of the substrate 110 to the internal bottom surface 110HS1. Restated, the one or more inner surfaces 110S of the substrate 110 that at least partially define the cavity 110H may include an internal bottom surface 110HS1 of the substrate 110 that is between the upper surface 110U and the lower surface 110L, and an internal side surface 110HS2 of the substrate 110 that connects the upper surface 110U to the internal bottom surface 110HS1. The image sensor 120 may be mounted on (e.g., directly or indirectly on) the internal bottom surface 110HS1 of the cavity 110H. Since a distance to the optical filter 150 or the lens may be reduced by the thickness of the substrate 110 remaining in a lower portion of the cavity 110H, the image sensor 120 may secure a distance to the optical filter 150 by adjusting a thickness 131h of the first support member 131. In an example, since the image sensor 120 is mounted on the internal bottom surface 110HS1 of the cavity 110H, the second stiffener 140 on the bottom surface of the substrate 110 may not be provided.

Figure 9A:
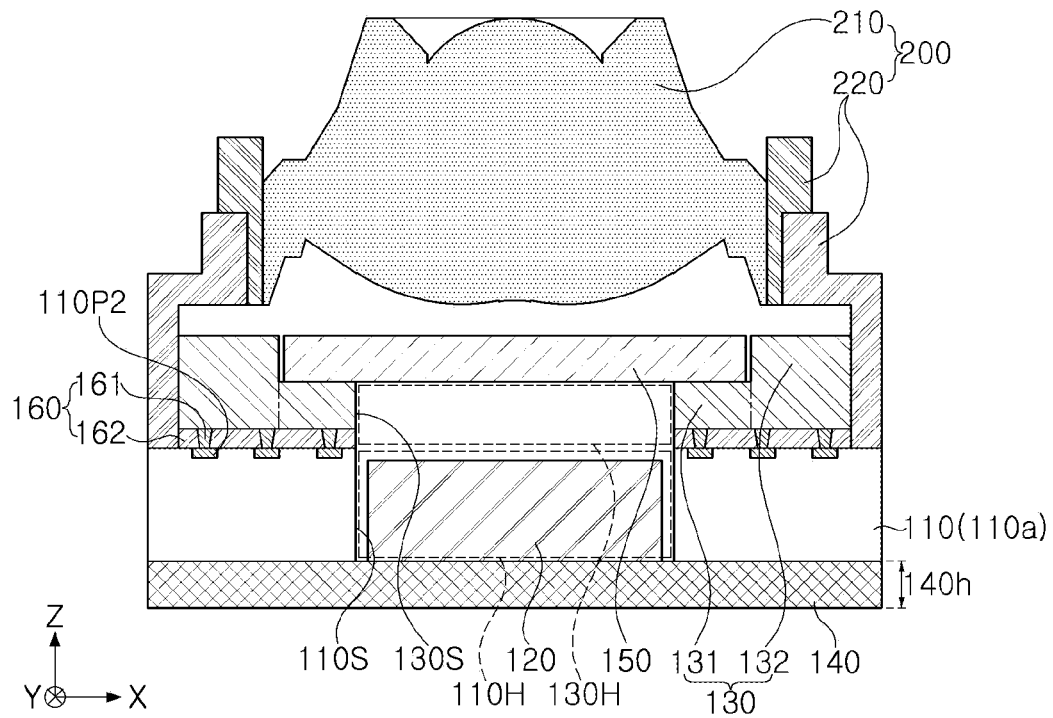
FIGS. 9A and 9B are cross-sectional diagrams illustrating an example of combination of a first module and a second module in an image sensor module according to some example embodiments of the present inventive concepts.
Figure 9B:
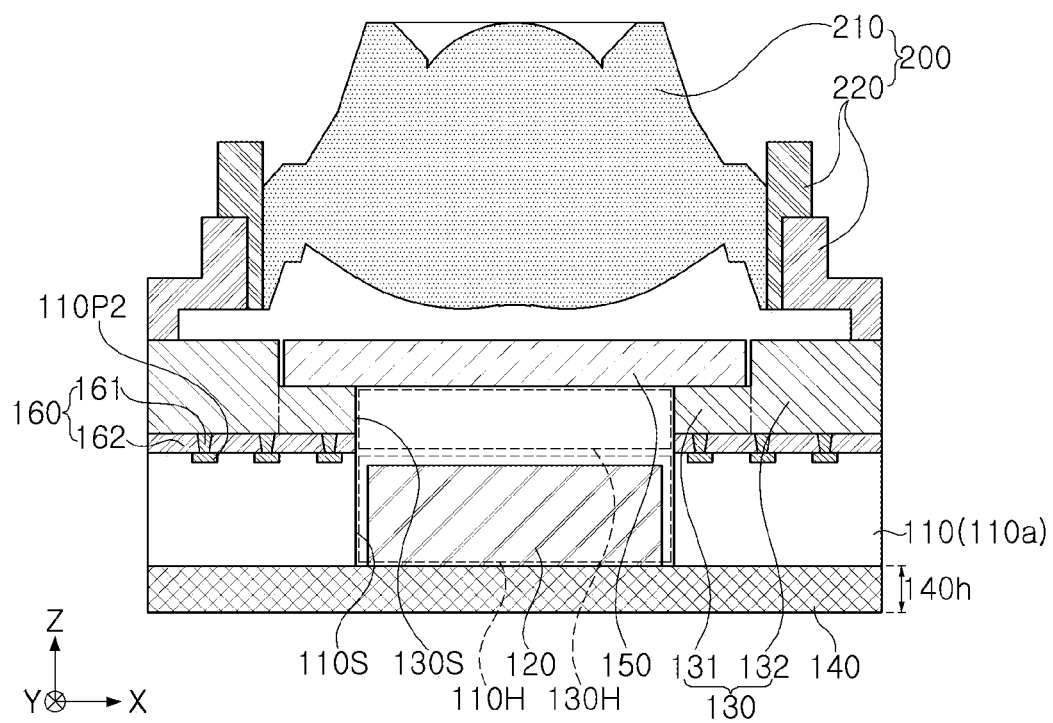

FIGS. 9A and 9B are cross-sectional diagrams illustrating an example of combination of a first module 100A and a second module 200 in an image sensor module 1000A (e.g., modules 100Af-1 or 100Af-2) according to some example embodiments.

Referring to FIGS. 9A and 9B, the second module 200 may be mounted on the substrate 110 or the first stiffener 130 (or the second support member 132) so as to be on (e.g., directly on, indirectly on, vertically overlapping, etc.) the image sensor 120 and the optical filter 150. The second module 200 may include a lens assembly 210 including a plurality of lenses aligned in an optical axis direction (Z axis direction, also referred to herein as a vertical direction extending perpendicular to the upper surface 110U of the substrate 110) and a lens housing 220 accommodating the lens assembly 210. The lens assembly 210 may be aligned with (e.g., overlapping) the image sensor 120 and the optical filter 150 in the optical axis direction (e.g., the Z axis direction). The lens housing 220 may include a holder unit supporting the lens assembly 210 and a driving unit driving the lens assembly 210 in the optical axis direction (e.g., the Z axis direction). The lens housing 220 may be mounted on the substrate 110 or the second support member 132. For example, as illustrated in FIG. 9A, the lens housing 220 may be mounted on an outer region of the upper surface of the substrate 110 and may accommodate the optical filter 150 and the first stiffener 130. The lens housing 220 may be fixed to the substrate 110 by an adhesive. For example, as illustrated in FIG. 9B, the first stiffener 130 may extend to an edge of the substrate 110 and may occupy a region larger than the example in FIG. 9A, and the lens housing 220 may be mounted on an uppermost surface (or the upper surface of the second support member 132) of the first stiffener 130. In this case, by sufficiently securing the area of the first stiffener 130, the thickness 140h of the second stiffener 140 on the lower surface of the substrate 110 may be reduced. Accordingly, the image sensor module may have a reduced size, and warpage acting on the substrate 110 and stress acting on the image sensor 120 may be effectively relieved.

Figure 10:
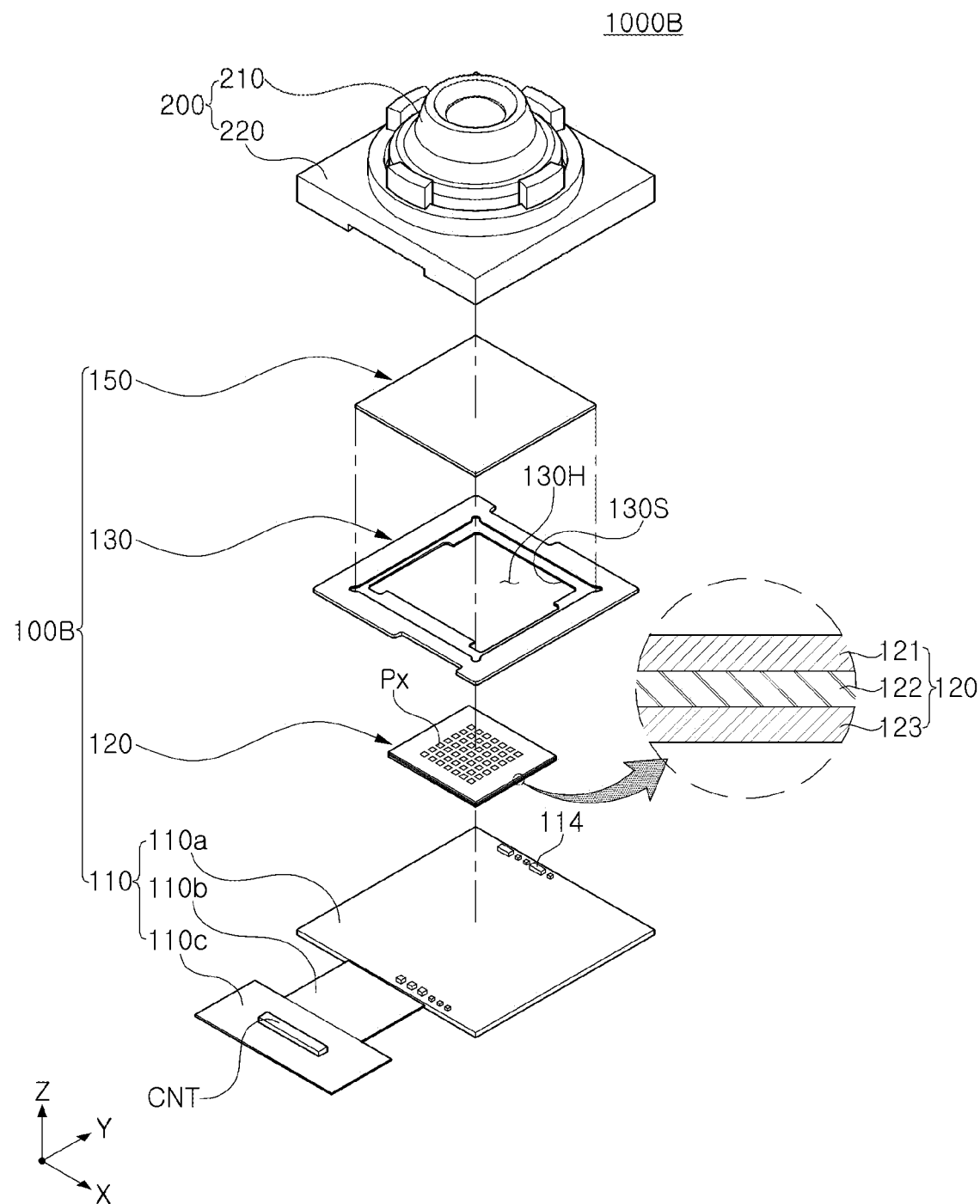
FIG. 10 is an exploded perspective diagram illustrating an image sensor module according to some example embodiments of the present inventive concepts.

FIG. 10 is an exploded perspective diagram illustrating an image sensor module 1000B according to some example embodiments.

Referring to FIG. 10, the image sensor module 1000B may include a first module 100B and a second module 200 (or "optical module") mounted on an upper portion of the first module 100B. In an example, differently from the first module 100A in FIG. 1, in the first module 100B, a cavity 110H (in FIG. 1) may not be formed in the substrate 110, and the stiffener 140 (in FIG. 1) disposed in a lower portion of the substrate 110 may not be provided. The image sensor 120 may be mounted on the upper surface of the substrate 110. In this case, to compensate for the distance between the image sensor 120 and the optical filter 150 reduced by the thickness of the substrate 110, the thickness of the first stiffener 130 disposed around the image sensor 120 may be increased. Accordingly, even though the second stiffener 140 (in FIG. 1) on the lower surface of the substrate 110 is not provided, warpage and stress acting on the image sensor 120 may be effectively relieved. Since the elements of the first module 100B and the second module 200 are the same as those described in the aforementioned example embodiments described with reference to FIG. 1, detailed descriptions thereof will not be provided.

Figure 11:
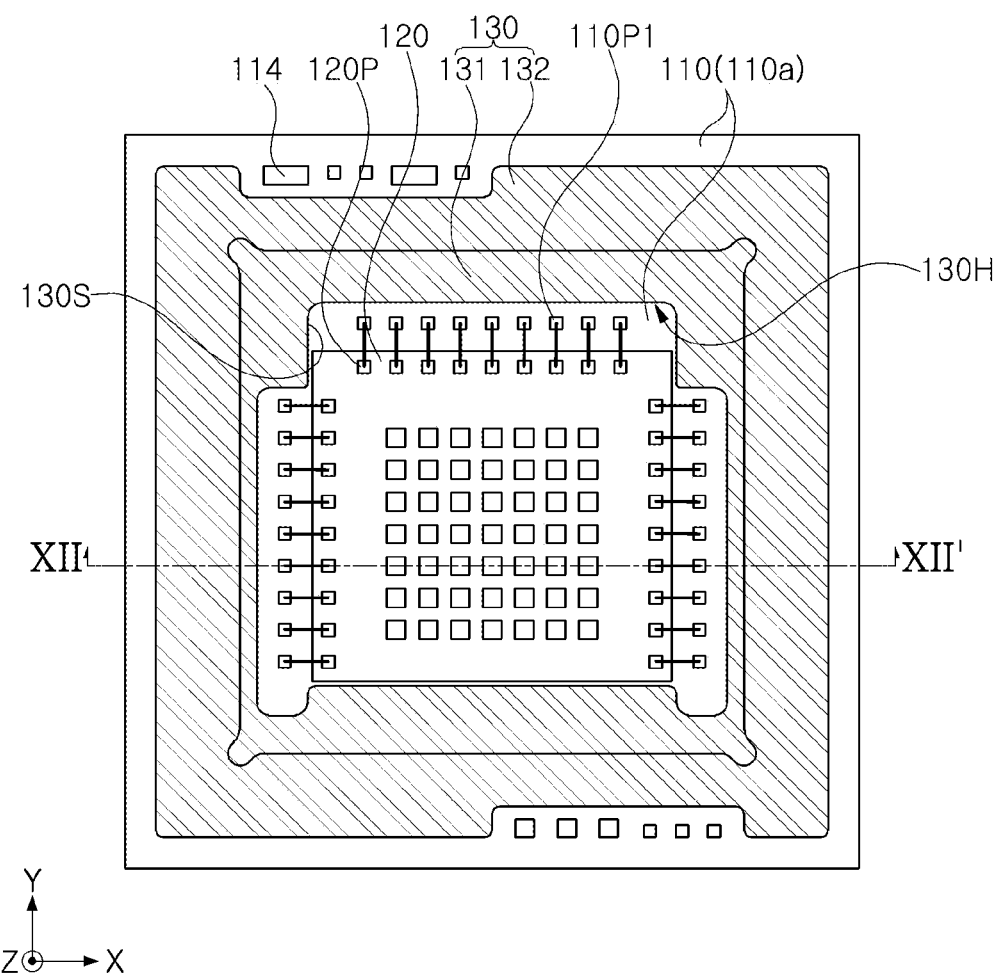
FIG. 11 is a plan diagram illustrating a portion of elements of a first module in the image sensor module illustrated in FIG. 10, according to some example embodiments of the present inventive concepts.
Figure 12:
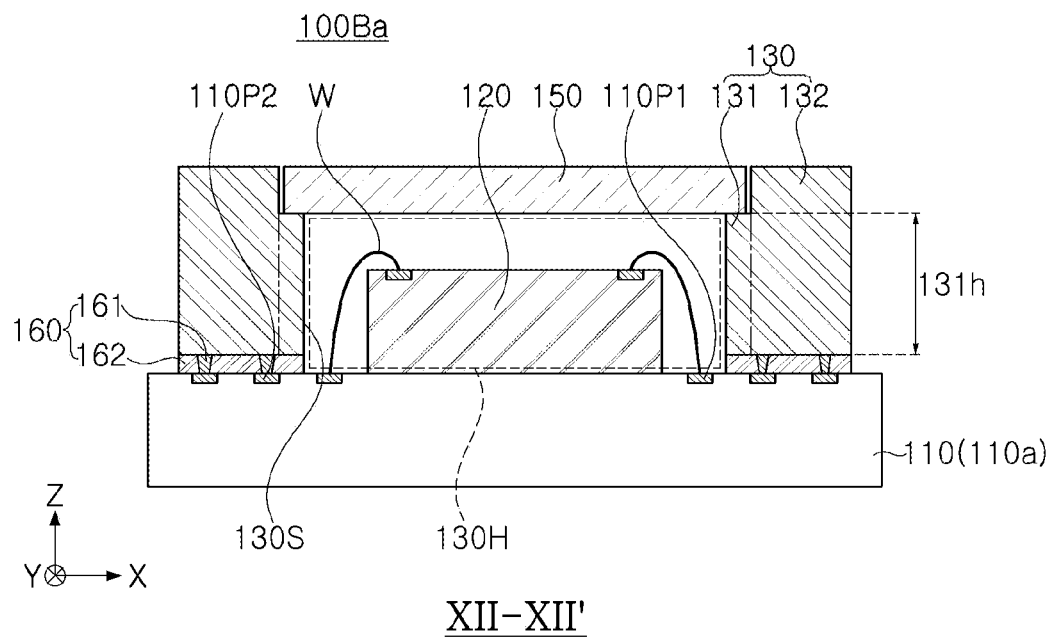
FIG. 12 is a cross-sectional diagram taken along line XII-XII' in FIG. 11, according to some example embodiments of the present inventive concepts.

FIG. 11 is a plan diagram illustrating a portion of elements of a first module 100B in the image sensor module 1000B illustrated in FIG. 10. FIG. 12 is a cross-sectional diagram taken along line XII-XII' in FIG. 11. FIG. 11 does not illustrate the first flexible substrate 110b, the second rigid substrate 110c, and the optical filter 150 illustrated in FIG. 10 and illustrates a bonding relationship among the substrate 110, the image sensor 120, and the first stiffener 130 on a plane.

Referring to FIGS. 11 and 12, a first module 100Ba in an example may include a substrate 110, an image sensor 120, a first stiffener 130, and an optical filter 150. The substrate 110 may have a plate shape having no cavity formed therein. The image sensor 120 may be mounted on the upper surface of the substrate 110. The first stiffener 130 may be disposed on the upper surface of the substrate 110 on which the second pad 110P2 is disposed. The first stiffener 130 may surround the image sensor 120 on the upper surface of the substrate 110, and may include a first support member 131 supporting a lower portion of the optical filter 150 and a second support member 132 extending from one side of the first support member 131 in the vertical direction (Z axis direction) and surrounding at least a portion of a side surface of the optical filter 150. A thickness 131h of the first stiffener 130 or the first support member 131 between the substrate 110 and the optical filter 150 may be greater than a thickness of the image sensor 120 mounted on the substrate 110. For example, the thickness 131h of the first support member 131 may be determined in consideration of a thickness of the image sensor 120, a distance between the image sensor 120 and the optical filter 150, a height of the bonding wire W, and the like. In this case, the thickness of the first stiffener 130 may be sufficiently secured, such that warpage and stress acting on the image sensor 120 may be effectively relieved without the second stiffener 140 (in FIG. 1) on the lower surface of the substrate 110.

Figure 13:
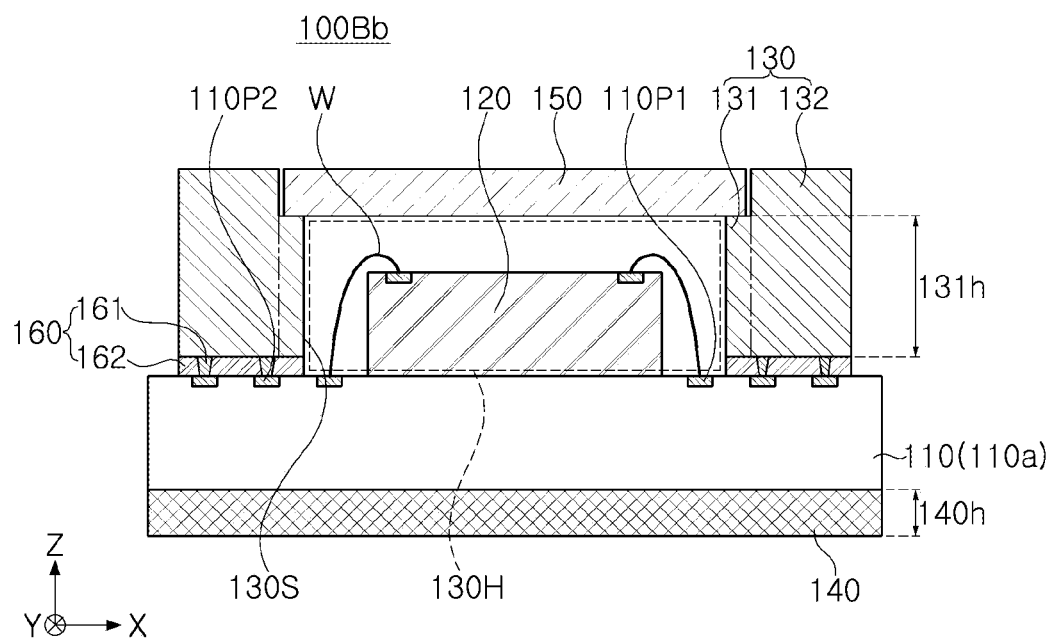
FIG. 13 is a cross-sectional diagram illustrating a modified example of a first module in an image sensor module according to some example embodiments of the present inventive concepts.

FIG. 13 is a cross-sectional diagram illustrating a modified example of a first module 100Bb in an image sensor module 1000B according to some example embodiments.

Referring to FIG. 13, in the modified example, the first module 100Bb may further include a second stiffener 140 disposed on a lower surface of the substrate 110. Even when the image sensor 120 is mounted on the substrate 110, by disposing the second stiffener 140 on the lower surface of the substrate 110, warpage and stress acting on the image sensor 120 may be reduced. In an example, the thickness 131h of the first support member 131 may be sufficiently secured in consideration of the thickness of the image sensor 120, the distance between the image sensor 120 and the optical filter 150, the height of the bonding wire W, and the like. Accordingly, by configuring the thickness 140h of the second stiffener 140 to be smaller than the thickness 131h of the first support member 131, an increase in the height of the first module 100Bb may be reduced.

Figure 14A:
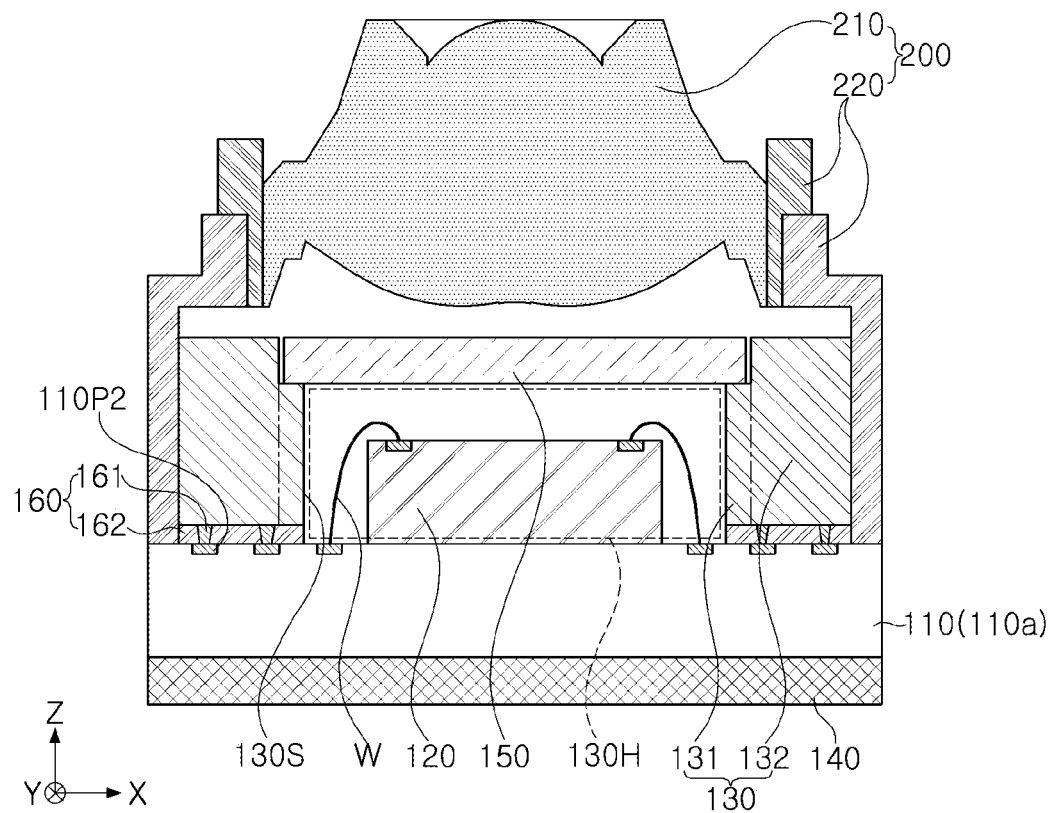
FIGS. 14A and 14B are cross-sectional diagrams illustrating an example of combination of a first module and a second module in an image sensor module according to some example embodiments of the present inventive concepts.
Figure 14B:
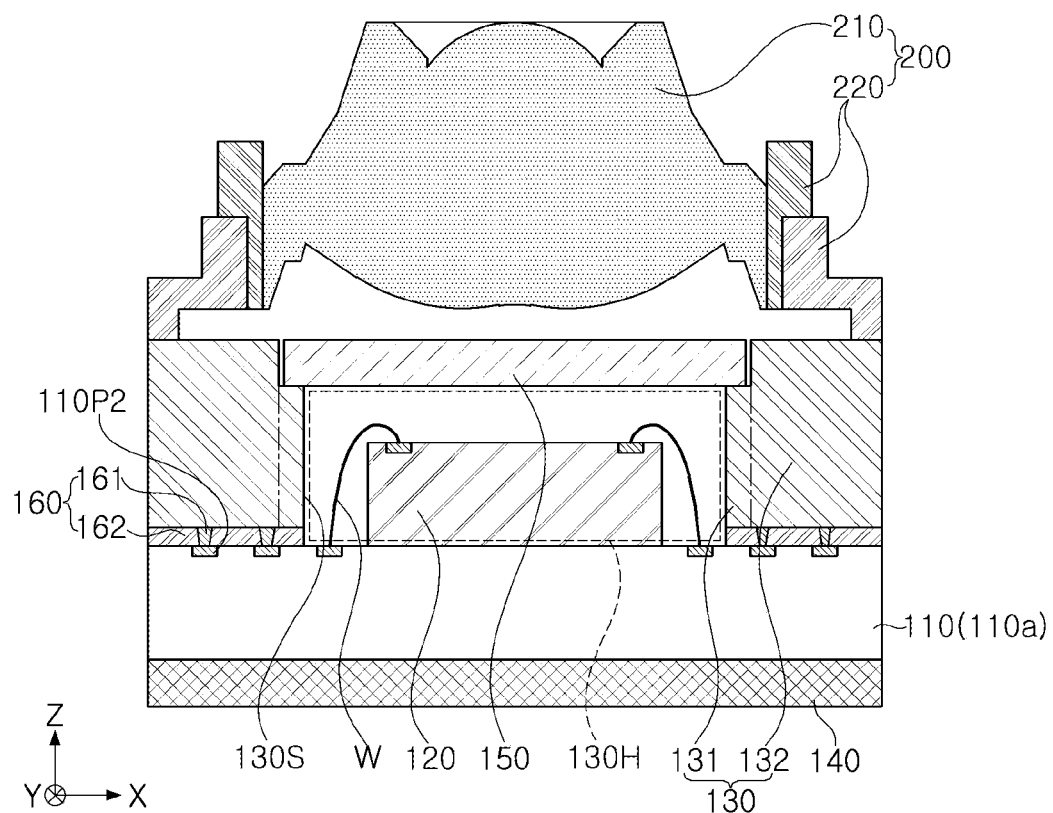

FIGS. 14A and 14B are cross-sectional diagrams illustrating an example of combination of a first module 100B and a second module 200 (e.g., module 100Bc-1 or 100Bc-2) in an image sensor module 1000B according to some example embodiments.

Referring to FIGS. 14A and 14B, similarly to the example described with reference to FIGS. 9A and 9B, a second module 200 may be disposed on a substrate 110 or a first stiffener 130 (or a second support member 132). For example, as illustrated in FIG. 14A, the lens housing 220 may be mounted on an outer region of the upper surface of the substrate 110 and may accommodate the optical filter 150 and the first stiffener 130. The lens housing 220 may be fixed on the substrate 110 by an adhesive. For example, as illustrated in FIG. 14B, the lens housing 220 may be mounted on an uppermost surface (or an upper surface of the second support member 132) of the first stiffener 130. In this case, by sufficiently securing an area of the first stiffener 130, stress acting on the image sensor 120 may be effectively relieved without the second stiffener 140 on the lower surface of the substrate 110.

Figure 15:
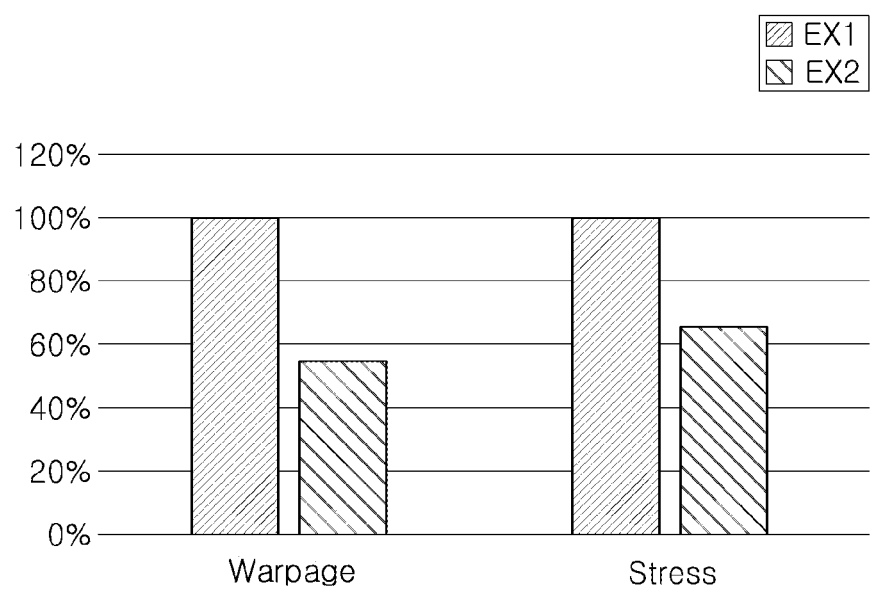
FIG. 15 is a graph illustrating an effect of reduction of warpage and stress by a first stiffener, according to some example embodiments of the present inventive concepts.

FIG. 15 is a graph illustrating an effect of reduction of warpage and stress by a first stiffener. FIG. 15 illustrates simulation results obtained by measuring the magnitude of warpage and stress in first experimental example EX1 and second experimental example EX2. In the first experimental example EX1, warpage and stress acting on the image sensor were measured when only the second stiffener 140 was applied. In the second experimental example EX2, warpage and stress acting on the image sensor were measured when the first and second stiffeners 130 and 140 were applied. In the first experimental example EX1, a structure in which the second support member 132 surrounding an external side of the optical filter 150 is provided in the first module 100Ab, illustrated in FIG. 5, was applied. In the second experimental example EX2, a structure of the first stiffener 130 in which the first and second support members 131 and 132 in FIGS. 3A and 3B are integrated was applied. In the first and second experimental examples EX1 and EX2, an image sensor of an optical format of 1/1.12 inch was used as an object.

Referring to FIG. 15, in the second experimental example EX2, warpage acting on the image sensor was reduced by about 45% and the stress was reduced by about 34% as compared to the first experimental example EX1. When a first stiffener including the second support member 132 (in FIG. 3A) was introduced on the upper surface of the substrate, it has been indicated that warpage and stress acting on the image sensor were effectively reduced.

Figure 16:
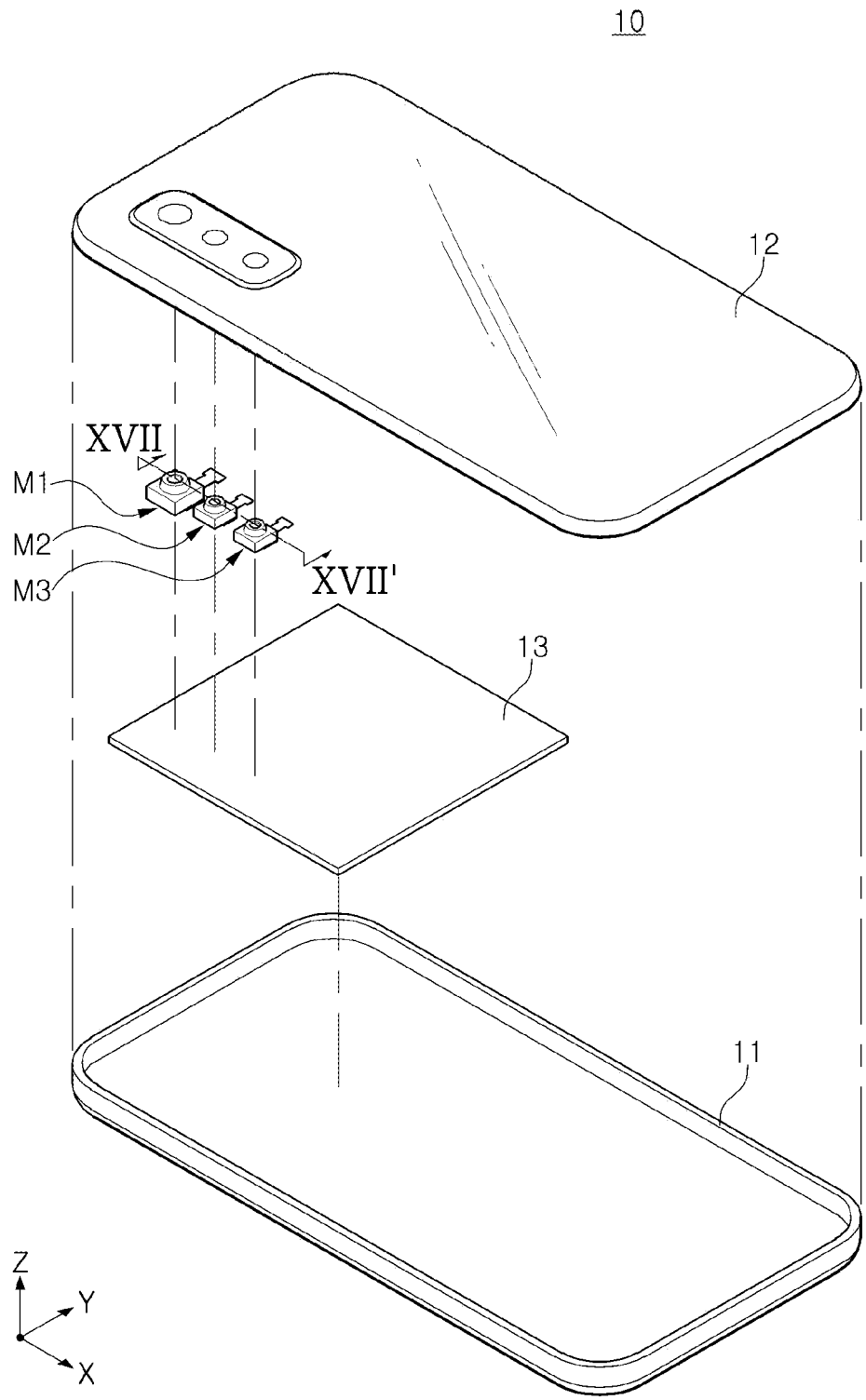
FIG. 16 is an exploded perspective diagram illustrating an electronic device including a plurality of image sensor modules, according to some example embodiments of the present inventive concepts.
Figure 17:
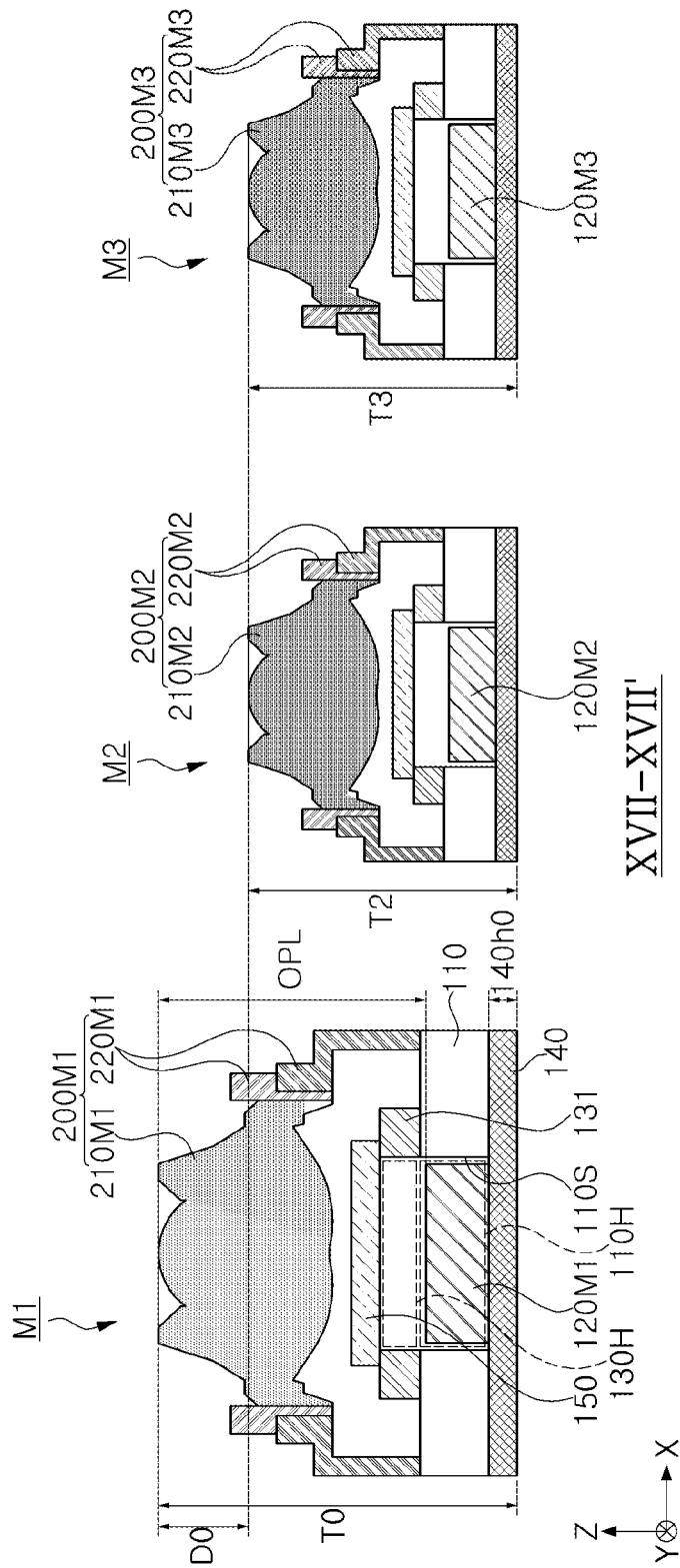
FIG. 17 is a cross-sectional diagram illustrating the plurality of image sensor modules illustrated in FIG. 16 taken long line XVII-XVII', according to some example embodiments of the present inventive concepts.
Figure 18:
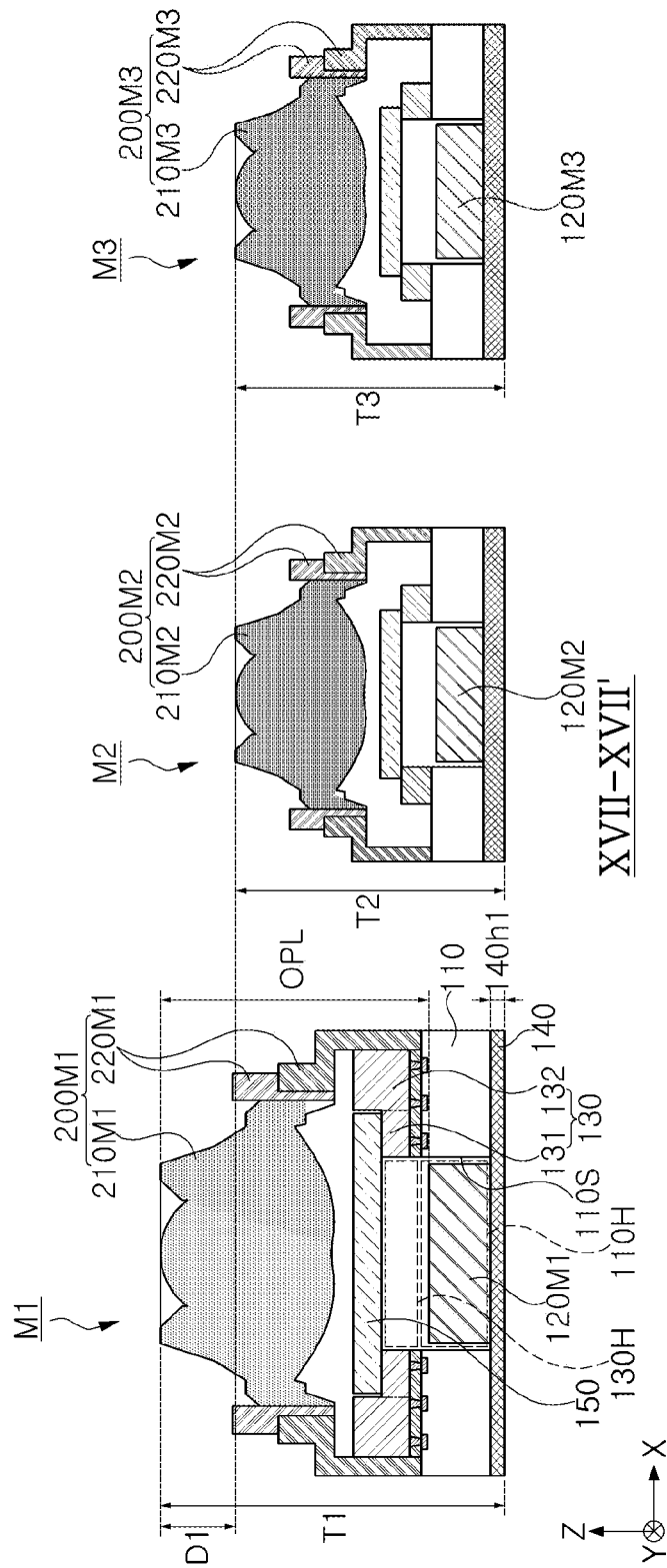
FIG. 18 is a cross-sectional diagram illustrating an example in which an image sensor module is applied to one of the image sensor modules illustrated in FIG. 17, according to some example embodiments of the present inventive concepts.

FIG. 16 is an exploded perspective diagram illustrating an electronic device including a plurality of image sensor modules M1, M2, and M3. FIG. 17 is a cross-sectional diagram illustrating the plurality of image sensor modules M1, M2, and M3 illustrated in FIG. 16 taken long line XVII-XVII'. FIG. 18 is a cross-sectional diagram illustrating an example in which an image sensor module is applied to an image sensor module M1 of the image sensor modules illustrated in FIG. 17.

Referring to FIG. 16, an electronic device 10 may include a first cover 11 forming one surface of the electronic device 10, a second cover 12 forming the other surface of the electronic device 10, a main board 13 disposed between the first and second covers 11 and 12, and a plurality of image sensor modules M1, M2, and M3 mounted on the main board 13. The electronic device 10 may include a smart phone, a laptop computer, a tablet computer, and a personal digital assistant (PDA). The plurality of image sensor modules M1, M2, and M3 may be configured as image sensor modules providing images of different resolutions. For example, the first image sensor module M1 may be configured as a high-resolution module including a large-sized image sensor, and the second and third image sensor modules M2 and M3 may be configured as modules including image sensors having sizes smaller than that of the first image sensor module M1. The most appropriate module among the plurality of image sensor modules M1, M2, and M3 may be selected depending on imaging conditions. The first image sensor module M1 may have a size greater than sizes of the second and third image sensor modules M2 and M3 since the first image sensor module M1 may need an optical module having a size corresponding to the large-sized image sensor. In the description below, the thicknesses (height in the Z-axis direction) of the plurality of image sensor modules M1, M2, and M3 will be compared with one another with reference to FIG. 17.

The main board 13, and/or any portions thereof may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device, for example a solid state drive (SSD), storing a program of instructions, and a processor (e.g., CPU) configured to execute the program of instructions to implement the functionality and/or methods performed by some or all of the electronic device 10 and/or any portion thereof.

Referring to FIG. 17, the first image sensor module M1 may include an image sensor 120M1 having an optical format of 1/1.33 inch or more and an optical module 200M1 spaced apart from the image sensor 120M1 by a particular (or, alternatively, predetermined) distance OPL (hereinafter "optical distance"), for example. To reduce a height T0 of the image sensor module M1 while the optical distance OPL between the image sensor 120M1 and the optical module 200M1 is maintained, the image sensor 120M1 may be accommodated in the cavity 110H of the substrate 110. The optical module 200M1 may have a lens assembly 210M1 and a lens housing 220M1 having size corresponding to the large-sized image sensor 120M1, and the substrate 110 to which the optical module 200M1 is attached may also have a large area. In this case, to control warpage caused by a difference in thermal expansion coefficient, the thickness 140h0 of the lower stiffener 140 to which the image sensor 120M1 is attached may need to be maintained to be a particular (or, alternatively, predetermined) level. Accordingly, the thickness T0 of the first image sensor module M1 may be determined by heights of the optical module 200M1 and the lower stiffener 140. The second and third image sensor modules M2 and M3 may include, for example, image sensors 120M2 and 120M3 having an optical format of less than 1/1.33 inch and optical modules 200M2 (having lens assembly 210M2 and lens housing 220M2) and 200M3 (having lens assembly 210M3 and lens housing 220M3) corresponding thereto. Accordingly, the thicknesses T2 and T3 of the second and third image sensor modules M2 and M3 may be smaller than the thickness T0 of the first image sensor module M1. The second and third image sensor modules M2 and M3 may have different structures and different thicknesses.

As described above, the sizes of the image sensor 120M1, 120M2, and 120M3 may determine the thickness of the image sensor module, and when image sensor modules M1, M2, and M3 having different thicknesses are mounted in the same electronic device, a specific image sensor module may protrude further than the other image sensor modules. For example, the thickness T0 of the first image sensor module M1 may be greater than the thicknesses T2 and T3 of the second and third image sensor modules M2 and M3, and the first image sensor module M1 may protrude by a difference in thickness between the first image sensor module M1 and the second and third image sensor modules M2 and M3. In the description below, changes in the thickness of the first image sensor module M1 of when the image sensor module of some example embodiments is applied to the first image sensor module M1 will be described with reference to FIG. 18.

Referring to FIG. 18, the first image sensor module M1 may include an upper stiffener 130 disposed on the substrate 110. The upper stiffener 130 may include a first support member 131 supporting a lower portion of the optical filter 150 and a second support member 132 extending in the vertical direction (Z-axis direction) from one side of the first support member 131. In the image sensor module M1 in the example, the upper stiffener 130 may control warpage acting on the substrate 110 and the image sensor 120M1. Accordingly, the thickness 140h1 of the lower stiffener 140 may be reduced while the optical distance OPL between the image sensor 120M1 and the optical module 200M1 is maintained. For example, the thickness T1 of the first image sensor module M1 in FIG. 18 may be smaller than the thickness T0 of the first image sensor module M1 in FIG. 17. The thickness difference D1 between the first image sensor module M1 and the second and third image sensor modules M2 and M3 in FIG. 18 may also be smaller than the thickness difference D0 between the first image sensor module M1 and the second and third image sensor modules M2 and M3 in FIG. 17. Accordingly, in some example embodiments, a phenomenon in which the image sensor module protrudes from an electronic device due to the difference in thickness of the plurality of image sensor modules M1, M2, and M3 in terms of appearance may be reduced.

Figure 19:
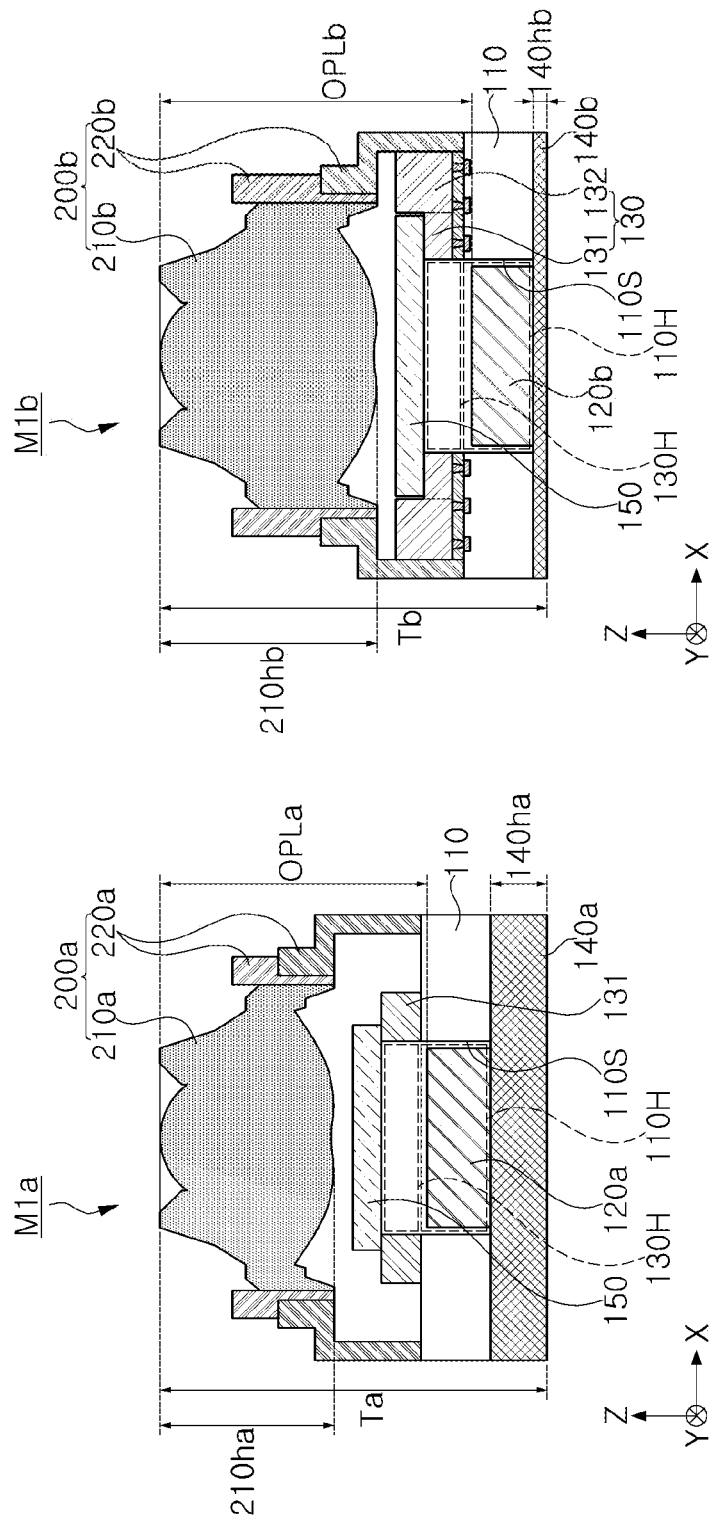
FIG. 19 is a cross-sectional diagram illustrating comparison between image sensor modules before and after an upper stiffener is applied, according to some example embodiments of the present inventive concepts.

FIG. 19 is a cross-sectional diagram illustrating comparison between image sensor modules M1a (including image sensor 120a, lower stiffener 140a, and optical module 200a having lens assembly 210a and lens housing 220a) and M1b (including image sensor 120b, lower stiffener 140b, and optical module 200b having lens assembly 210b and lens housing 220b) before and after an upper stiffener is applied according to some example embodiments. FIG. 19 illustrates changes in optical distances OPLa and OPLb and in thicknesses 210ha and 210hb of a lens assembly caused by a difference in thicknesses 140ha and 140hb of lower stiffeners 140a and 140b before and after an upper stiffener 130 is applied to the first image sensor module M1 illustrated in FIG. 16.

Referring to FIG. 19, a 1-1 image sensor module M1a before the upper stiffener 130 is applied may require a particular (or, alternatively, predetermined) optical distance OPLa and a particular (or, alternatively, predetermined) thickness 140ha of the lower stiffener 140a within a specific thickness Ta. In a 1-2th image sensor module M1b after the upper stiffener 130 is applied, the optical distance OPLb may be further secured by reducing the thickness 140hb of the lower stiffener 140b within the same thickness Tb as that of the 1-1th image sensor module M1a. Accordingly, in the 1-2th image sensor module M1b, the optical module 200b may include a lens assembly 210b having an increased thickness 210hb by combining lenses of various specifications. In some example embodiments, as compared to the thickness Ta of the 1-1th image sensor module M1a having image sensor 120a, the optical module 200b of various specifications (e.g., the number of lenses, the size of the lenses, and the like) and the image sensor 120b corresponding thereto may be mounted without increasing the thickness Tb of the 1-2th image sensor module M1b.

For example, the 1-1th image sensor module M1a and the 1-2nd image sensor module M1b may have different focal lengths and different aperture values. When the camera application is executed in the electronic device 10, a preview screen may be firstly displayed using the 1-1th image sensor module M1a. When a user changes an imaging mode in a camera application or executes a zooming operation such that a zooming magnification reaches a particular (or, alternatively, predetermined) reference magnification, a preview screen generated by the 1-2 image sensor module M1b may be displayed. As described above, by mounting the image sensor modules M1a and M1b of various specifications, having different aperture values, different focal lengths, and the like, in a single electronic device 10, camera performance of the electronic device 10 may improve.

According to the aforementioned example embodiments, by introducing a stiffener on the upper surface of the module substrate, an image sensor module with reduced stress acting on the image sensor may be provided.

While some example embodiments have been illustrated and described above, it will be apparent to those skilled in the art that modifications and variations could be made without departing from the scope of the present inventive concepts as defined by the appended claims.

What is claimed is:

1. An image sensor device, comprising:
an image sensor;
a substrate including
an upper surface and a lower surface opposite to each other,
one or more inner surfaces at least partially defining a cavity extending through the substrate in a vertical direction that extends perpendicular to the upper surface which surrounds the cavity, wherein the image sensor is at least partially within the cavity, and
first and second pads isolated from direct contact with each other in a horizontal direction extending parallel to the upper surface, the first and second pads being on the upper surface;
an optical filter on both the upper surface of the substrate and the image sensor;
a first support member between the substrate and the optical filter, the optical filter being in direct contact with the first support member;
a second support member adjacent to the first support member on the substrate and closer to an outer edge of the substrate than the first support member in the horizontal direction; and
an optical device overlapping the optical filter and the image sensor in the vertical direction,
wherein the image sensor is electrically connected to the first pad,
wherein at least one of the first or second support members is electrically connected to the second pad, and
wherein the optical filter vertically overlaps the support member and the upper surface of the substrate.

2. The image sensor device of claim 1, wherein the first and second support members are isolated from direct contact with each other in the horizontal direction, and
the second support member surrounds both an outer side surface of the first support member and an outer side surface of the optical filter in the horizontal direction.

3. The image sensor device of claim 1, wherein a thickness of the second support member in the vertical direction is greater than a thickness of the first support member in the vertical direction.

4. The image sensor device of claim 1, wherein
the first and second support members are integrated with each other,
the first support member has one or more inner surfaces at least partially defining an opening that exposes the image sensor and a first region of the upper surface, and
the second support member extends from one side of the first support member in the vertical direction.

5. The image sensor device of claim 4, wherein the first pad is on the first region of the upper surface.

6. The image sensor device of claim 4, wherein
the upper surface of the substrate has a second region surrounding the first region and having the first and second support members attached thereto, and
the second pad is on the second region of the upper surface.

7. The image sensor device of claim 1, wherein
the one or more inner surfaces include
an internal bottom surface of the substrate between the upper surface the substrate and the lower surface of the substrate, and
an internal side surface of the substrate, the internal side surface connecting the upper surface of the substrate to the internal bottom surface of the substrate, and
the image sensor is on the internal bottom surface of the cavity.

8. The image sensor device of claim 1, further comprising:
a stiffener attached to the lower surface,
wherein the cavity extends from the upper surface to the lower surface and penetrates the substrate, and
wherein the image sensor is on the stiffener.

9. The image sensor device of claim 8, wherein a thickness of the stiffener in the vertical direction is smaller than a thickness of the first support member in the vertical direction.

10. The image sensor device of claim 1, further comprising:
an electrical connection member between the substrate and at least one support member of the first support member or the second support member, the electrical connection member electrically connecting the at least one support member to the second pad; and
an insulating member surrounding the electrical connection member between the substrate and the at least one support member.

11. The image sensor device of claim 10, wherein
the at least one support member includes iron (Fe) or a first metal alloy including iron (Fe), and
the electrical connection member includes tin (Sn) or a second metal alloy including tin (Sn).

12. The image sensor device of claim 1, wherein
the substrate further includes at least one wiring layer including a signal pattern, a power pattern, and a ground pattern,
the first pad is electrically connected to at least one of the signal pattern, the power pattern, or the ground pattern, and
the second pad is electrically connected to the ground pattern.

13. The image sensor device of claim 1, wherein an optical format of the image sensor is in a range of 1/1.33 inch to 1 inch.

14. The image sensor device of claim 1, further comprising:
one or more passive devices on the upper surface of the substrate and between the second support member and the outer edge of the substrate.

15. The image sensor device of claim 1, wherein the optical device includes
a lens assembly on the optical filter, and
a lens housing on the substrate and/or the second support member and configured to structurally support the lens assembly.

16. An image sensor device, comprising:
a substrate having
an upper surface on which a first pad and a second pad are located while being spaced apart from each other in a horizontal direction extending parallel to the upper surface,
a lower surface opposite to the upper surface, and
one or more inner surfaces at least partially defining a cavity extending from the upper surface to the lower surface in a vertical direction extending perpendicular to the upper surface;
an upper stiffener on the upper surface of the substrate, the upper stiffener having one or more inner surfaces at least partially defining an opening at least partially overlapping with the cavity in the vertical direction;
a lower stiffener on the lower surface of the substrate;
an image sensor in the cavity and on the lower stiffener;
an optical filter on the upper stiffener and covering the cavity and the opening; and
an optical device on the image sensor and the optical filter,
wherein the image sensor is electrically connected to the first pad,
wherein the upper stiffener is electrically connected to the second pad, and
wherein the optical filter vertically overly the upper stiffener and the substrate.

17. The image sensor device of claim 16, wherein
a plane area of the opening is in a first plane extending parallel to the upper surface of the substrate is greater than a plane area of the cavity in a second plane extending parallel to the upper surface of the substrate,
the cavity is in the plane area of the opening, and
the first pad on the upper surface is adjacent to the cavity in the horizontal direction, and is exposed through the opening in the vertical direction.

18. An image sensor device, comprising:
a substrate having an upper surface on which first and second pads are located, the substrate further having a lower surface that is opposite to the upper surface;
an image sensor on or in the substrate and electrically connected to the first pad;
an upper stiffener on the upper surface of the substrate and electrically connected to the second pad; and
an optical filter on the image sensor and the upper stiffener,
wherein the optical filter vertically overlaps the upper stiffener and the upper surface of the substrate.

19. The image sensor device of claim 18, wherein
the image sensor is on the upper surface of the substrate, and
a thickness of the upper stiffener between the substrate and the optical filter is greater than a thickness of the image sensor.

20. The image sensor device of claim 18, further comprising:
a lower stiffener attached to the lower surface of the substrate,
wherein the substrate includes one or more inner surfaces at least partially defining a cavity extending from the upper surface to the lower surface and penetrating the substrate, and
wherein the image sensor is in the cavity and is on the lower stiffener.

* * * * *